United States Patent
Funabashi et al.

(10) Patent No.: US 6,614,823 B2
(45) Date of Patent: Sep. 2, 2003

(54) SEMICONDUCTOR LASER DEVICE HAVING A DIFFRACTION GRATING ON A LIGHT REFLECTION SIDE

(75) Inventors: Masaki Funabashi, Tokyo (JP); Naoki Tsukiji, Tokyo (JP); Junji Yoshida, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/983,175

(22) Filed: Oct. 23, 2001

(65) Prior Publication Data

US 2002/0154665 A1 Oct. 24, 2002

(30) Foreign Application Priority Data

Apr. 19, 2001 (JP) ........................................ 2001-121731

(51) Int. Cl.[7] ................................................. H01S 5/00
(52) U.S. Cl. ........................................... 372/45; 372/46
(58) Field of Search ............................. 372/45, 46, 108

(56) References Cited

U.S. PATENT DOCUMENTS

| | | | | |
|---|---|---|---|---|
| 4,885,753 A | * | 12/1989 | Okai et al. ..................... 372/49 |
| 5,845,030 A | * | 12/1998 | Sasaki et al. ................... 385/88 |
| 5,960,023 A | * | 9/1999 | Takahashi ..................... 372/96 |
| 6,175,581 B1 | * | 1/2001 | Sato ............................. 372/96 |
| 6,252,895 B1 | * | 6/2001 | Nitta et al. ............... 359/337.5 |
| 6,282,340 B1 | * | 8/2001 | Nasu et al. .................... 372/96 |
| 6,285,477 B1 | * | 9/2001 | Miyazaki et al. ............. 372/50 |
| 6,384,963 B2 | | 5/2002 | Ackerman et al. |
| 6,438,150 B1 | * | 8/2002 | Yoo .............................. 385/37 |

* cited by examiner

*Primary Examiner*—Paul Ip
*Assistant Examiner*—Tuan Nguyen
(74) *Attorney, Agent, or Firm*—Oblon, Spivak, McClelland, Maier & Neustadt, P.C.

(57) ABSTRACT

A semiconductor device includes an active layer configured to radiate light, a light reflecting facet positioned on a first side of the active layer, a light emitting facet positioned on a second side of the active layer thereby forming a resonant cavity between the light reflecting facet and the light emitting facet, and a partial diffraction grating having a predetermined length and positioned on a light reflecting side of the resonator. The predetermined length of the partial diffraction grating is selected such that the semiconductor device emits a light beam having a plurality of longitudinal modes within a predetermined spectral width of an oscillation wavelength spectrum of the semiconductor device. The predetermined length of the partial diffraction grating may be set in relation to a length of the resonant cavity, or in relation to a coupling coefficient of the diffraction grating. The semiconductor device may also include another partial diffraction grating positioned on the light emitting side of the laser device.

40 Claims, 14 Drawing Sheets

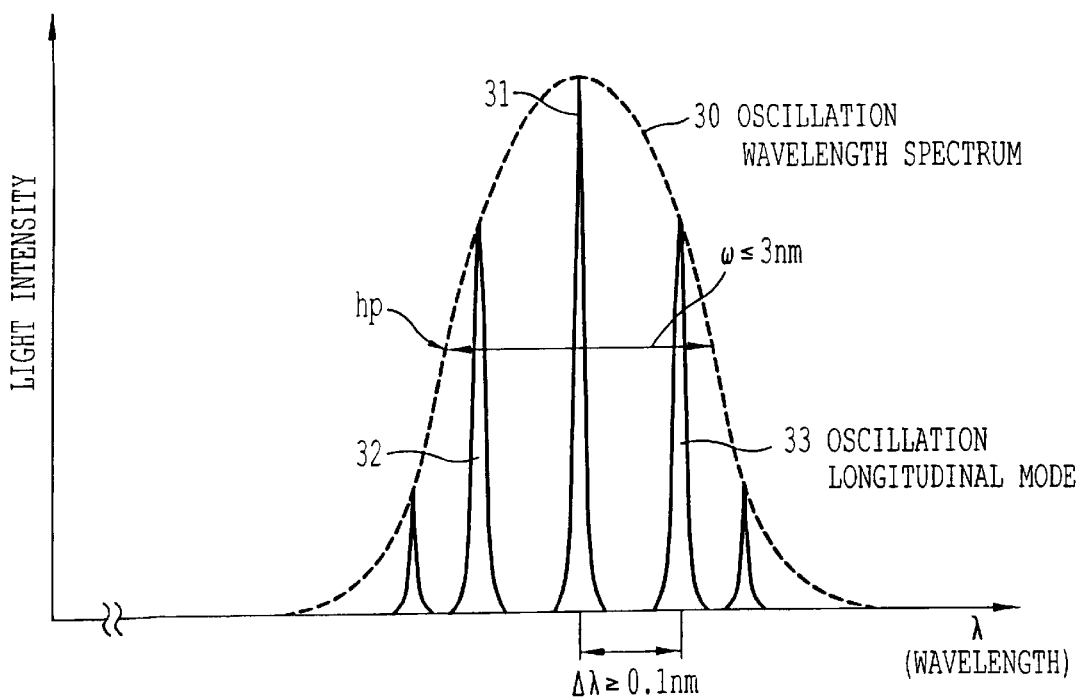
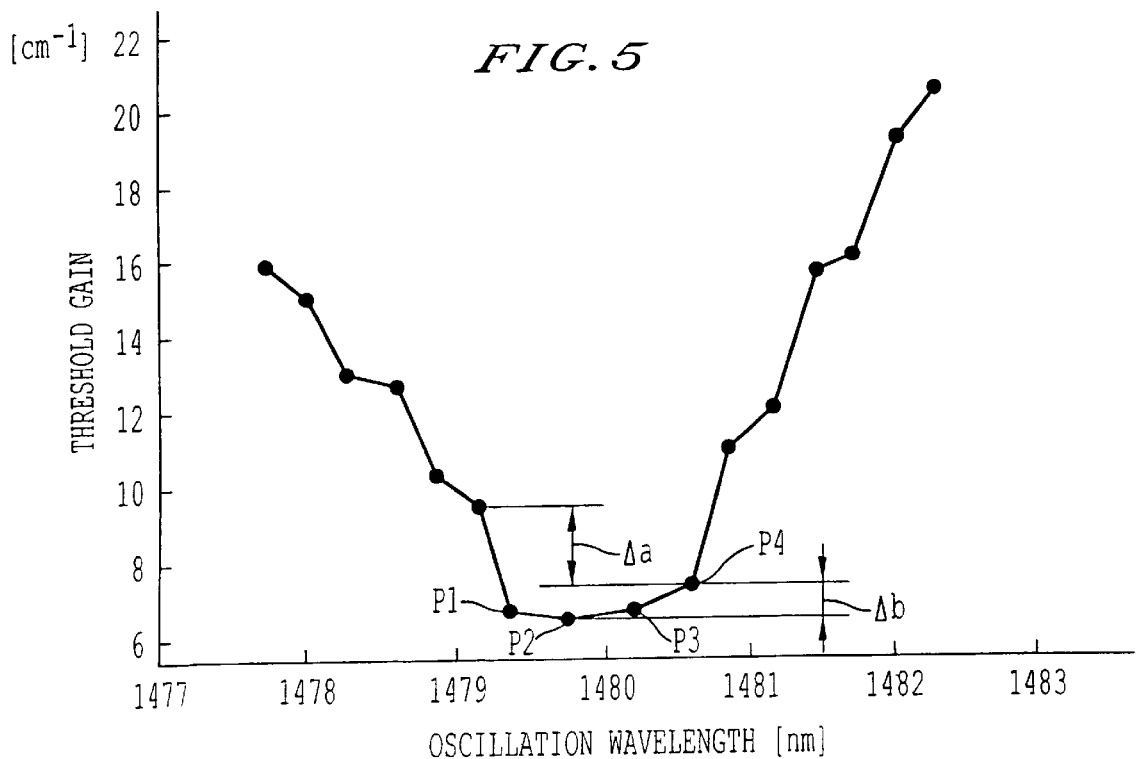

SEMICONDUCTOR LASER DEVICE HAVING A DIFFRACTION GRATING ON A LIGHT REFLECTION SIDE

BACKGROUND OF THE INVENTION

1. Field of the Invention

The present invention relates to a semiconductor laser device for use in a semiconductor laser module suitable as an excitation light source for a Raman amplification system, and more particularly to a semiconductor laser device having a diffraction grating on a light reflection side.

2. Discussion of the Background

With the proliferation of multimedia features on the Internet in the recent years, there has arisen a demand for larger data transmission capacity for optical communication systems. Conventional optical communication systems transmitted data on a single optical fiber at a single wavelength of 1310 nm or 1550 nm, which have reduced light absorption properties for optical fibers. However, in order to increase the data transmission capacity of such single fiber systems, it was necessary to increase the number of optical fibers laid on a transmission route which resulted in an undesirable increase in costs.

In view of this, there has recently been developed wavelength division multiplexing (WDM) optical communications systems such as the dense wavelength division multiplexing (DWDM) system wherein a plurality of optical signals of different wavelengths can be transmitted simultaneously through a single optical fiber. These systems generally use an Erbium Doped Fiber Amplifier (EDFA) to amplify the data light signals as required for long transmission distances. WDM systems using EDFA initially operated in the 1550 nm band which is the operating band of the Erbium Doped fiber Amplifier and the band at which gain flattening can be easily achieved. While use of WDM communication systems using the EDFA has recently expanded to the small gain coefficient band of 1580 nm, there has nevertheless been an increasing interest in an optical amplifier that operates outside the EDFA band because the low loss band of an optical fiber is wider than a band that can be amplified by the EDFA; a Raman amplifier is one such optical amplifier.

In a Raman amplifier system, a strong pumping light beam is pumped into an optical transmission line carrying an optical data signal. As is known to one of ordinary skill in the art, a Raman scattering effect causes a gain for optical signals having a frequency approximately 13 THz smaller than the frequency of the pumping beam. Where the data signal on the optical transmission line has this longer wavelength, the data signal is amplified. Thus, unlike an EDFA where a gain wavelength band is determined by the energy level of an Erbium ion, a Raman amplifier has a gain wavelength band that is determined by a wavelength of the pumping beam and, therefore, can amplify an arbitrary wavelength band by selecting a pumping light wavelength. Consequently, light signals within the entire low loss band of an optical fiber can be amplified with the WDM communication system using the Raman amplifier and the number of channels of signal light beams can be increased as compared with the communication system using the EDFA.

Although the Raman amplifier amplifies signals over a wide wavelength band, the gain of a Raman amplifier is relatively small and, therefore, it is preferable to use a high output laser device as a pumping source. However, merely increasing the output power of a single mode pumping source leads to undesirable stimulated Brillouin scattering and increased noises at high peak power values. Therefore, the Raman amplifier requires a pumping source laser beam having a plurality of oscillating longitudinal modes. As seen in FIGS. 15A and 15B, stimulated Brillouin scattering has a threshold value $P_{th}$ at which the stimulated Brillouin scattering is generated. For a pumping source having a single longitudinal mode as in the oscillation wavelength spectrum of FIG. 15A, the high output requirement of a Raman amplifier, for example 300 mW, causes the peak output power of the single mode to be higher than $P_{th}$ thereby generating undesirable stimulated Brillouin scattering. On the other hand, a pumping source having multiple longitudinal modes distributes the output power over a plurality of modes each having a relatively low peak value. Therefore, as seen in FIG. 15B, a multiple longitudinal mode pumping source having the required 300 mW output power can be acquired within the threshold value $P_{th}$ thereby eliminating the stimulated Brillouin scattering problem and providing a larger Raman gain.

In addition to the multiple longitudinal modes required for a pump laser in a Raman amplification system, the present inventors have recognized that it is desirable that each of the longitudinal modes has substantially the same threshold gain in order to obtain the stable multi-mode oscillation.

In addition, because the amplification process in a Raman amplifier is quick to occur, when a pumping light intensity is unstable, a Raman gain is also unstable. These fluctuations in the Raman gain result in fluctuations in the intensity of an amplified signal which is undesirable for data communications. Therefore, in addition to providing multiple longitudinal modes, the pumping light source of a Raman amplifier must have relatively stable intensity.

Moreover, Raman amplification in the Raman amplifier occurs only for a component of signal light having the same polarization as a pumping light. That is, in the Raman amplification, since an amplification gain has dependency on a polarization, it is necessary to minimize an influence caused by the difference between a polarization of the signal light beam and that of a pumping light beam. While a backward pumping method causes no polarization problem because the difference in polarization state between the signal light and the counter-propagating pumping light is averaged during transmission, a forward pumping method has a strong dependency on a polarization of pumping light because the difference in polarization between the two co-propagating waves is preserved during transmission. Therefore, where a forward pumping method is used, the dependency of Raman gain on a polarization of pumping light must be minimized by polarization-multiplexing of pumping light beams, depolarization, and other techniques for minimizing the degree of polarization (DOP). In this regard it is known that the multiple longitudinal modes provided by the pumping light source help to provide this minimum degree of polarization.

FIG. 16 is a block diagram illustrating a configuration of the conventional Raman amplifier used in a WDM communication system. In FIG. 16, semiconductor laser modules 182a through 182d, include paired Fabry-Pérot type semiconductor light-emitting elements 180a through 180d having fiber gratings 181a through 181d respectively. The laser modules 182a and 182b output laser beams having the same wavelength via polarization maintaining fiber 71 to polarization-multiplexing coupler 61a. Similarly, the laser modules 182c and 182d output laser beams having the same wavelength via polarization maintaining fiber 71 to polarization-multiplexing coupler 61b. Each polarization maintaining fiber 71 constitutes a single thread optical fiber which has a fiber grating 181a–181d inscribed on the fiber. The polarization-multiplexing couplers 61a and 61b respectively output the polarization-multiplexed laser beams to a WDM coupler 62. These laser beams outputted from the polarization-multiplexing couplers 61a and 61b have different wavelengths.

The WDM coupler 62 multiplexes the laser beams outputted from the polarization-multiplexing couplers 61a and 61b, and outputs the multiplexed light beams as a pumping light beam to external isolator 60, which outputs the beam to amplifying fiber 64 via WDM coupler 65. Signal light beams to be amplified are input to amplifying fiber 64 from signal light inputting fiber 69 via polarization-independent isolator 63. The amplified signal light beams are Raman-amplified by being multiplexed with the pumping light beams and input to a monitor light branching coupler 67 via the WDM coupler 65 and the polarization-independent isolator 66. The monitor light branching coupler 67 outputs a portion of the amplified signal light beams to a control circuit 68, and the remaining amplified signal light beams as an output laser beam to signal light outputting fiber 70. The control circuit 68 performs feedback control of a light-emitting state, such as, an optical intensity, of each of the semiconductor light-emitting elements 180a through 180d based on the portion of the amplified signal light beams input to the control circuit 68 such that the resulting Raman amplification gain is flat over wavelength.

FIG. 17 is an illustration showing a general configuration of a conventional fiber grating semiconductor laser module 182a–182d used in the conventional Raman amplifier system of FIG. 16. As seen in FIG. 17, semiconductor laser module 201 includes a semiconductor light-emitting element (laser diode) 202 and an optical fiber 203. The semiconductor light-emitting element 202 has an active layer 221 provided with a light reflecting surface 222 at one end thereof, and a light irradiating surface 223 at the other end. Light beams generated inside the active layer 221 are reflected on the light reflecting surface 222 and output from the light irradiating surface 223.

Optical fiber 203 is disposed on the light irradiating surface 223 of the semiconductor light-emitting element 222, and is optically coupled with the light irradiating surface 223. Fiber grating 233 is formed at a position of a predetermined distance from the light irradiating surface 223 in a core 232 of the optical fiber 203, and the fiber grating 233 selectively reflects light beams of a specific wavelength. That is, the fiber grating 233 functions as an external resonator between the fiber grating 233 and the light reflecting surface 222, and selects and amplifies a laser beam of a specific wavelength which is then output as an output laser beam 241.

While the conventional fiber grating semiconductor laser module 182a–182d provides the multiple longitudinal modes necessary for use in a Raman amplifier, the fiber grating module of FIG. 17 is problematic in that residual reflection occurs at the front facet 223 of the laser diode 202, and the module has a large value of relative intensity noise (RIN) which reflects large fluctuations in light intensity. As discussed above, this fluctuation in the pumping light intensity is undesirable for Raman amplification because it could generate a fluctuation in Raman gain which in turn causes the amplified signal to fluctuate. The large value RIN is especially undesirable for Raman amplifiers using a forward pumping method, where the signal light of weakened intensity and the pumping light of high intensity propagate in the same direction. Therefore, even though the conventional fiber grating laser module provides multiple longitudinal modes which allow a diminished degree of polarization as needed in a forward pumping method, the forward pumping method is not frequently used with the fiber grating module because of the high RIN of such module.

The mechanical structure of the fiber grating laser module also causes instability of the conventional pumping light source. Specifically, because the optical fiber 203 with fiber grating 233 is laser-welded to the package, mechanical vibration of the device or a slight shift of the optical fiber 203 with respect to the light emitting element 202 could cause a change in oscillating characteristics and, consequently, an unstable light source. This shift in the alignment of the optical fiber 203 and light emitting element 202 is generally caused by changes in ambient temperature. In this regard, such changes in ambient temperature also cause small changes in oscillation wavelength selected by the fiber grating 233, further contributing to instability of the pumping light source.

Yet another problem associated with the fiber grating laser module is the high loss caused by the need for an external isolator. In a laser module with a fiber grating, an isolator cannot be intervened between the semiconductor laser device and the optical fiber because the external cavity oscillation is governed by the reflection from the fiber grating. That is, the isolator would prevent the reflected light from the grating from returning to the semiconductor laser device. Therefore, the fiber grating laser module has a problem in that it is susceptible to reflection and easily influenced. Moreover, as seen in FIG. 26, a Raman amplifier system using the fiber grating module must use external isolator 60. As is known in the art, this isolator presents a relatively high loss to the pumping light due to a connection between the collecting lens and output fiber of the external isolator.

SUMMARY OF THE INVENTION

Accordingly, one object of the present invention is to provide a laser device and method for providing a light source suitable for use as a pumping light source in a Raman amplification system, but which overcomes the above described problems associated with a fiber grating laser module.

Another aspect of the present invention is to provide a laser device and method for providing multiple oscillation modes having substantially the same threshold gain.

The semiconductor device on which the method is based includes an active layer configured to radiate light, a light reflecting facet positioned on a first side of the active layer, a light emitting facet positioned on a second side of the active layer thereby forming a resonant cavity between the light reflecting facet and the light emitting facet, and a partial diffraction grating having a predetermined length and positioned on a light reflecting side of the resonator. The predetermined length of the partial diffraction grating is selected such that the semiconductor device emits a light beam having a plurality of longitudinal modes within a predetermined spectral width of an oscillation wavelength spectrum of the semiconductor device. The light reflecting facet may be configured to have a reflectivity of no more than 5% or no less than 80%, and the light emitting facet may be configured to have a reflectivity of no more than 5%.

According to one aspect of the invention, the predetermined length of the partial diffraction grating is set in relation to a length of the resonant cavity. In this aspect, the predetermined length of the partial diffraction grating is set to meet the inequality:

$$L_{gr} \leq \tfrac{1}{2} L,$$

where Lgr is the predetermined length of the partial diffraction grating and L is the length of the resonant cavity.

According to another aspect of the invention, the predetermined length of the partial diffraction grating is set in relation to a coupling coefficient of the diffraction grating. In this aspect, the predetermined length of the partial diffraction grating is set to meet the inequality:

$$\kappa i \cdot L_{gr} \geq 2,$$

where κi is the coupling coefficient of the partial diffraction grating, and Lgr is the length of the partial diffraction grating. Also according to this aspect, the partial diffraction grating has a thickness tgr, a distance from the active layer dsp, and a diffraction grating composition wavelength λgr, and at least one of the parameters tgr, dsp, and λgr is a predetermined value such that the coupling coefficient κi is set in relation to the grating length Lgr. The pitch of the partial diffraction grating may be configured such that the center wavelength is a shorter or longer wavelength than a peak wavelength of the gain spectrum determined by the active layer.

The semiconductor device may also include another partial diffraction grating positioned on the light emitting side of the laser device. In this aspect, the reflectivity of each of the light reflecting and light emitting facets is no greater than 5%. In addition, the laser device and method of the present invention may be applied in a semiconductor laser module, optical fiber amplifier, Raman amplifier, or wavelength division multiplexing system.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a graph showing the multiple oscillation longitudinal mode output characteristics of a diffraction grating semiconductor laser device in accordance with one embodiment of the present invention;

FIG. 5 is a diagram showing the relation of oscillation wavelength and threshold gain of a laser device in accordance with the present invention;

DETAILED DESCRIPTION OF THE PREFERRED EMBODIMENTS

Figure 1:
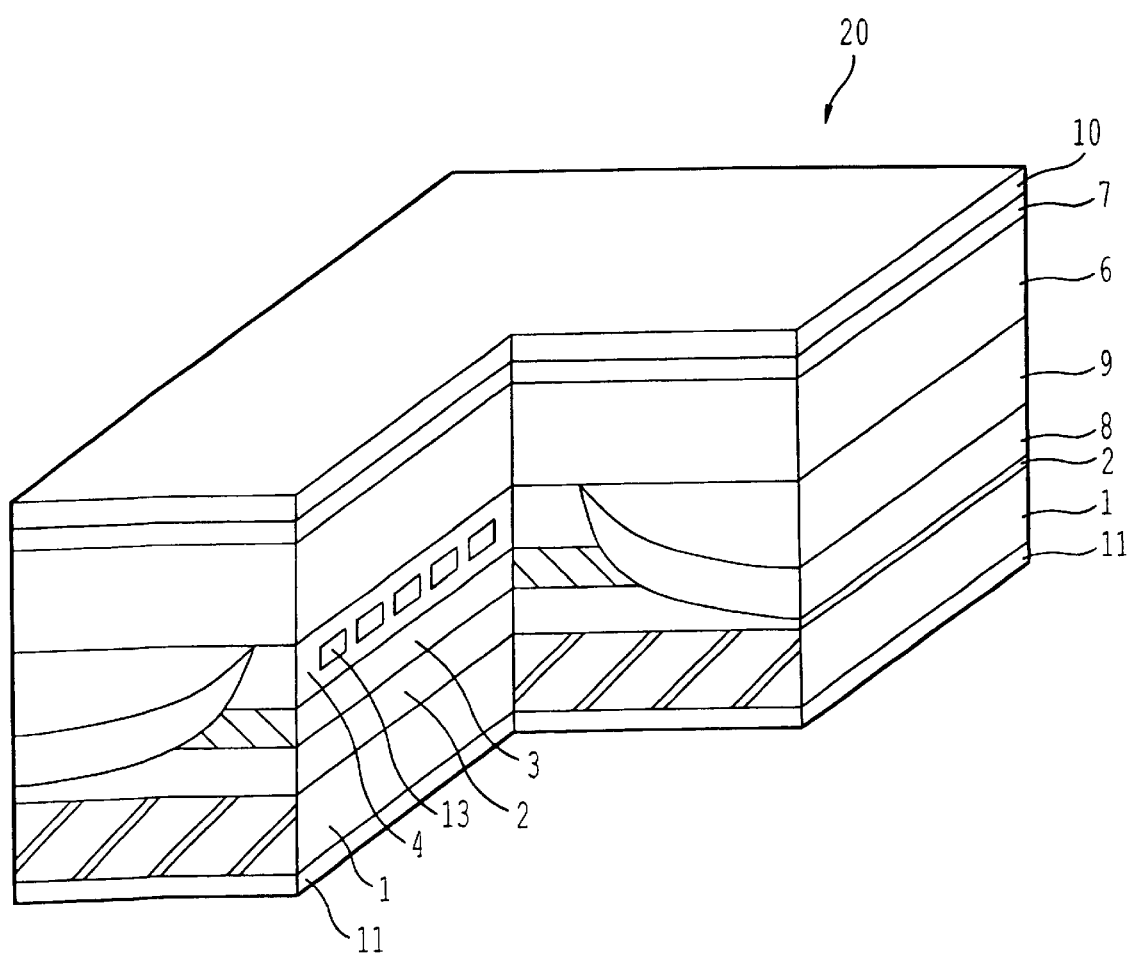
FIG. 1 is a broken perspective view showing a general configuration of a semiconductor laser device according to an embodiment of the present invention.
Figure 2:
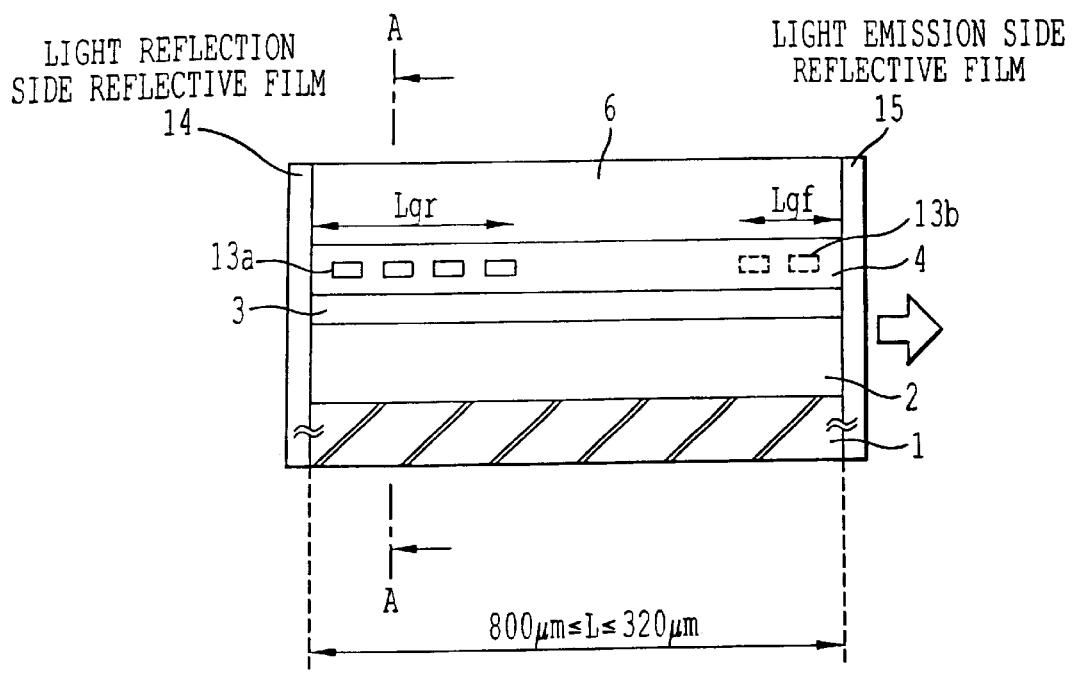
FIG. 2 is a vertical sectional view in the longitudinal direction of the semiconductor laser device shown in FIG. 1.
Figure 3:
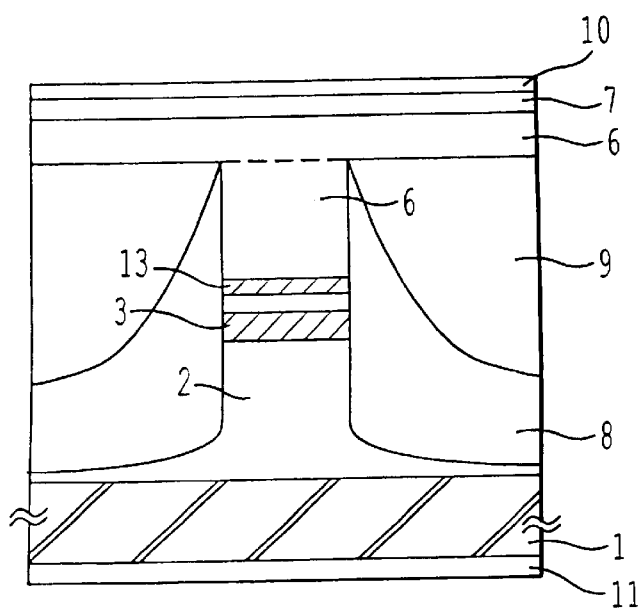
FIG. 3 is a cross sectional view of the semiconductor laser device, taken along the line A—A of the semiconductor laser device shown in FIG. 2.

Referring now to the drawings wherein like elements are represented by the same reference designation throughout, and more particularly to FIGS. 1, 2 and 3 thereof, there is shown a semiconductor laser device for providing a light source suitable for use as a pumping light source in a Raman amplification system in accordance with an embodiment of the present invention. FIG. 1 is a broken perspective view showing a general configuration of a semiconductor laser device according to an embodiment of the present invention. FIG. 2 is a vertical sectional view in the longitudinal direction of the semiconductor laser device shown in FIG. 1, and FIG. 3 is a cross sectional view of the semiconductor laser device, taken along the line A—A in FIG. 2.

The semiconductor laser device 20 of FIGS. 1–3 includes an n-InP substrate 1 having an n-InP buffer layer 2, an active layer 3, a p-InP spacer layer 4, a p-InP cladding layer 6, and an InGaAsP cap layer 7 sequentially stacked on a face (100) of the substrate 1. Buffer layer 2 serves both as a buffer layer by the n-InP material and an under cladding layer, while the active layer 3 is a graded index separate confinement multiple quantum well (GRIN-SCH-MQW) and has a compression strain. A diffraction grating 13a of a p-InGaAsP material is periodically formed within the p-InP spacer layer 4 along a portion the entire length of active layer 3. The diffraction grating 13a of the embodiment of FIG. 1 has a film thickness of 20 nm, a pitch of 220 nm, and selects a laser beam having a central wavelength of 1480 nm, to be emitted by the semiconductor laser device 20. It is to be noted however, that the present invention is applicable to wavelengths of 1100 nm to 1550 nm As best seen in FIG. 3, the p InP spacer layer 4 having the diffraction grating 13, the GRIN-SCH-MQW active layer 3, and the upper part of the n-InP buffer layer 2 are processed in a mesa strip shape. The sides of the mesa strip are buried by a p-InP blocking layer 8 and an n-InP blocking layer 9 formed as current blocking layers. In addition, a p-side electrode 10 is formed on the upper surface of InGaAsP cap layer 7, and an n-side electrode 11 is formed on the back surface of n-InP substrate 1.

As seen in FIG. 2, reflective film 14 having high reflectivity of, for example, 80% or more is formed on a light reflecting end surface that is one end surface in the longitudinal direction of the semiconductor laser device 20. Antireflection coating 15 having low light reflectivity of, for example, 5% or less, is formed on a light irradiating end surface opposing the light reflecting end surface of semiconductor laser device 20. The reflective film 14 and the antireflection coating 15 form a light resonator within the active region 3 of the semiconductor laser device 20. A light beam generated inside the GRIN-SCH-MQW active layer 3 of the light resonator is reflected by the reflective film 14 and irradiated as an output laser beam via the antireflection coating 15.

As also seen in FIG. 2, the resonator length L may be 800 $\mu$m to 3200 $\mu$m as will be further described below, but is 1200 $\mu$m in the preferred embodiment. In the embodiment of FIG. 2, the diffracting grating 13a is 500 $\mu$m and extends along only a portion of the length of the resonator and is placed so as to extend from the reflective coating 14. That is, the diffraction grating 13a is a partial grating positioned on the light reflection side of the device 20. As used herein, the phrase "positioned on the light reflection side" means that the distance from the antireflective film 15 to a grating element of grating 13a closest to the film 15 is larger than the distance from the reflective film 14 to the grating element of grating 13a closest to the film 14. As also shown in FIG. 2, the present invention may also include a grating 13b extending from the light emission side reflective film 15 of the laser device. The diffraction grating 13b is shown in phantom to indicate that it is not necessary for the present invention as will be discussed below. The gratings 13a and 13b distribute and feed back the light produced in the active layer as a laser beam that is emitted mainly from the exit side of the reflective film 15. In this regard, the diffraction gratings 13a and 13b are preferably placed so that the end grating element is in contact with its respective reflective film 14 or 15. However, due to inaccuracies in the cleaving position as will be further described below, the diffraction gratings 13a and 13b may be positioned apart from the reflective film 15 as shown in FIG. 2, as long as the diffraction gratings still perform their respective functions.

Thus, as seen in the embodiment of FIGS. 1–3, the present invention provides a partial diffraction grating positioned on a light reflection side of the semiconductor laser device 20. The present inventors have realized that such an integrated diffraction grating contained within the semiconductor laser device provides several advantages over external fiber grating laser modules such as the one described with respect to FIG. 17.

Figure 16:
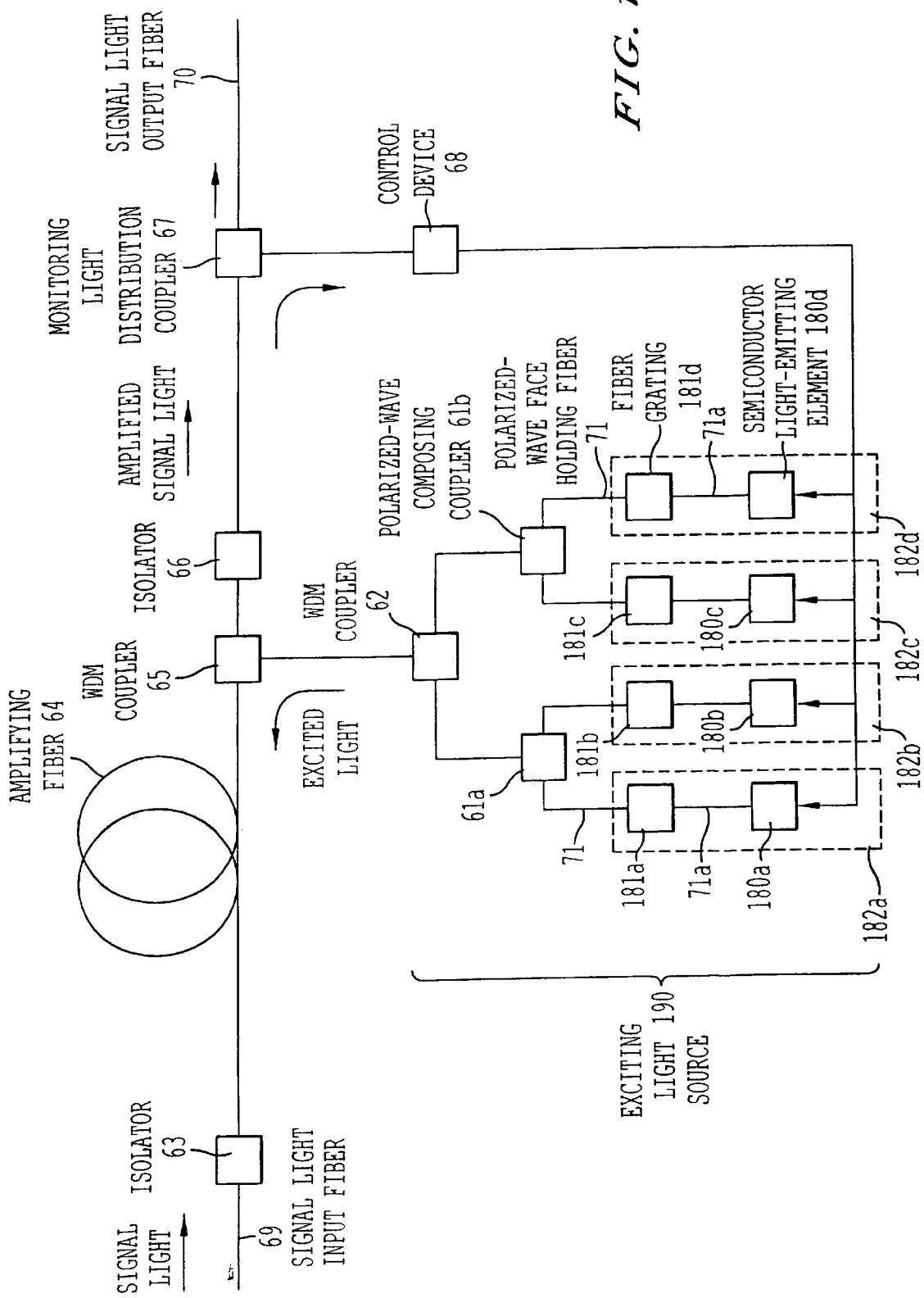
FIG. 16 is a block diagram illustrating a general configuration of a conventional Raman amplifier.
Figure 17:
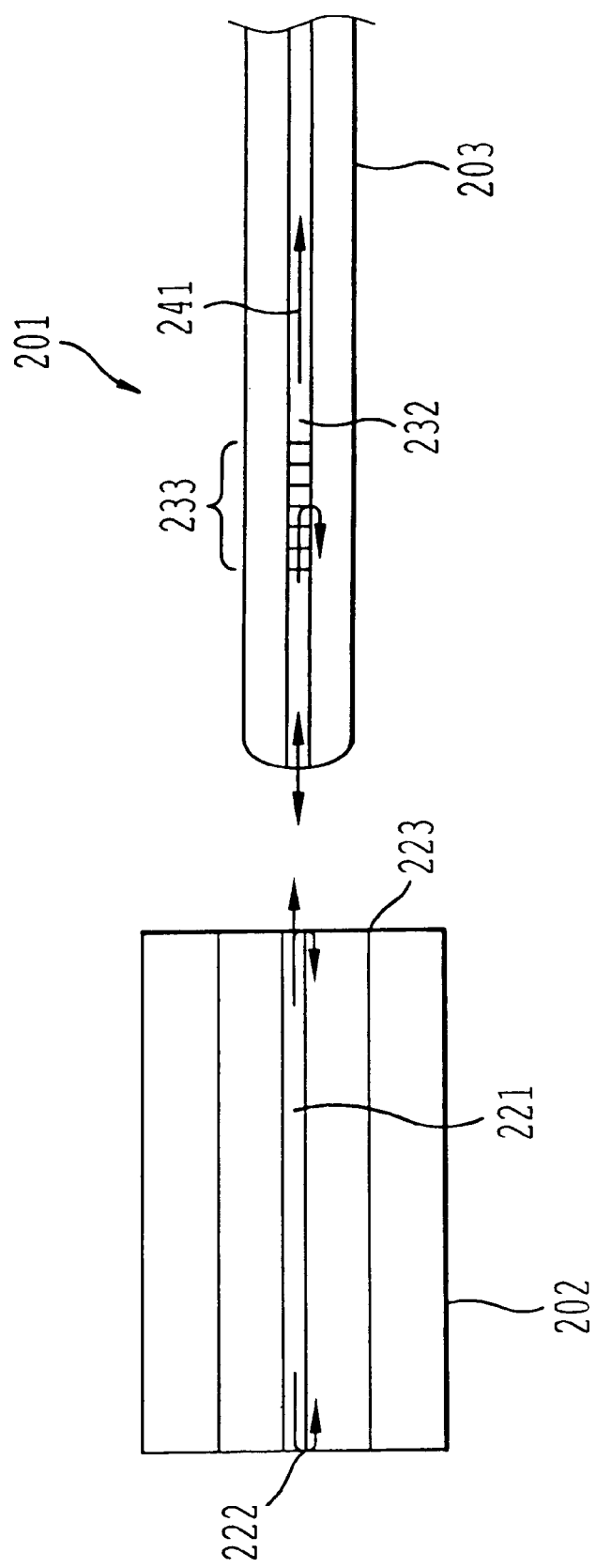
FIG. 17 is a diagram showing a configuration of a semiconductor laser module used in the Raman amplifier shown in FIG. 16.

First, the semiconductor laser module illustrated in FIG. 17 provides a light source with high RIN which is contrary to the requirements of a Raman amplifier as discussed above. Referring again to FIG. 17, the present inventors have discovered that the fiber grating semiconductor laser module 201 (182a through 182d in FIG. 16) has a large RIN due to multiple resonance. The multiple resonance is the resonance that occurs between the external fiber grating 233 and the light reflecting surface 222, and the resonance that occurs between the reflecting surface 222 and the light emitting surface 223 of the semiconductor laser emitting element 202. That is, due to the long interval between the fiber grating 233 and the semiconductor light-emitting element 202, stable Raman amplification cannot be performed. However, since the semiconductor laser device 20 of the present invention provides a laser beam irradiated from the low reflection coating 15 directly as an excitation light source of the Raman amplifier without using an external fiber grating, the RIN is smaller. As a result, the fluctuation of the Raman gain becomes smaller and a stable Raman amplification can be performed in systems using an integrated diffraction grating semiconductor laser device in accordance with the present invention. Another reason about low RIN is as follows. According to the iGM, an isolation can be set in a package of a LD module. Then the isolation can be located near the LD.

Moreover, because of the low RIN level, the integrated grating semiconductor laser device of the present invention is not constrained to a backward pumping method when used in a Raman amplification system as with fiber grating semiconductor laser modules. Applicants have recognized that the backward pumping method is most frequently used in present fiber grating Raman amplifier systems because the forward pumping method, in which a weak signal light beam advances in the same direction as a strong excited light beam, has a problem in that fluctuation-associated noises of pumping light are easy to be modulated onto the signal. As discussed above, the semiconductor laser device of the present invention provides a stable pumping light source for Raman amplification and therefore can easily be adapted to a forward pumping method.

The mechanical stability problems of the semiconductor laser module illustrated in FIG. 17 are also diminished by the present invention. Since the resonator of the diffraction grating device is not physically separated from the semiconductor laser device but monolithically integrated therein, the semiconductor laser device of this first embodiment does not experience a variation of the oscillating characteristic of a laser caused by mechanical vibration or change in ambient temperature and can acquire a stable light output and Raman gain. Moreover, as the diffraction grating of the present invention is internal to the semiconductor device, the temperature of the grating is controlled by the temperature control unit that provides temperature control for the semiconductor device. This not only eliminates the affects of ambient temperature changes on the oscillation wavelength selected by the grating, but also provides a mechanism for controlling the oscillation wavelength of a multiple mode laser device in accordance with the present invention as will be further described below. While the integrated diffraction grating device of the present invention provides the above-described advantages over the fiber grating laser module, the primary use of the present invention is as a pumping source for a Raman amplifier. Therefore, the integrated diffraction grating device of the present invention must also provide multiple longitudinal mode operation. Despite the fact that conventional integrated grating devices provided only single mode operation suitable for a signal light source, the present inventors have discovered that multiple mode operation suitable for a pumping light source for Raman amplification can be provided by an integrated diffraction grating device.

FIG. 4 shows the multiple oscillation longitudinal mode output characteristics of a diffraction grating semiconductor laser device of the present invention. As seen in this figure, the oscillation wavelength spectrum 30 provides multiple longitudinal modes, for example 31, 32, and 33, separated by a wavelength interval $\Delta\lambda$. As the integrated diffraction grating of the laser device of the present invention selects a longitudinal mode by its Bragg wavelength, FIG. 4 also shows the predetermined spectral width w of the oscillation spectrum 30 as defined by of half power points hp of the oscillation spectrum. The predetermined spectral width w is a predetermined spectral bandwidth, which defines a portion of the wavelength oscillation spectrum that includes the laser operating modes. Thus, while FIG. 4 shows the predetermined spectral width w as the full width at half maximum power (FWHM), it is to be understood that the predetermined spectral width w may be defined by any width on the oscillation spectrum 30. For example, another known way to define the predetermined spectral width is by the 10 db down from maximum power points of the oscillation wavelength spectrum 30. It is clear from this description that the number of laser operating modes may change for a given oscillation wavelength spectrum depending on how the predetermined spectral width w is defined. Thus, as recognized by the present inventors, in order to provide the multiple oscillation longitudinal mode characteristics required to reduce stimulated Brillouin scattering in a Raman amplifier, an integrated diffraction grating laser device of the present invention must provide a plurality of oscillation longitudinal modes within the predetermined spectral width w of the oscillation wavelength spectrum 30.

Figure 12:
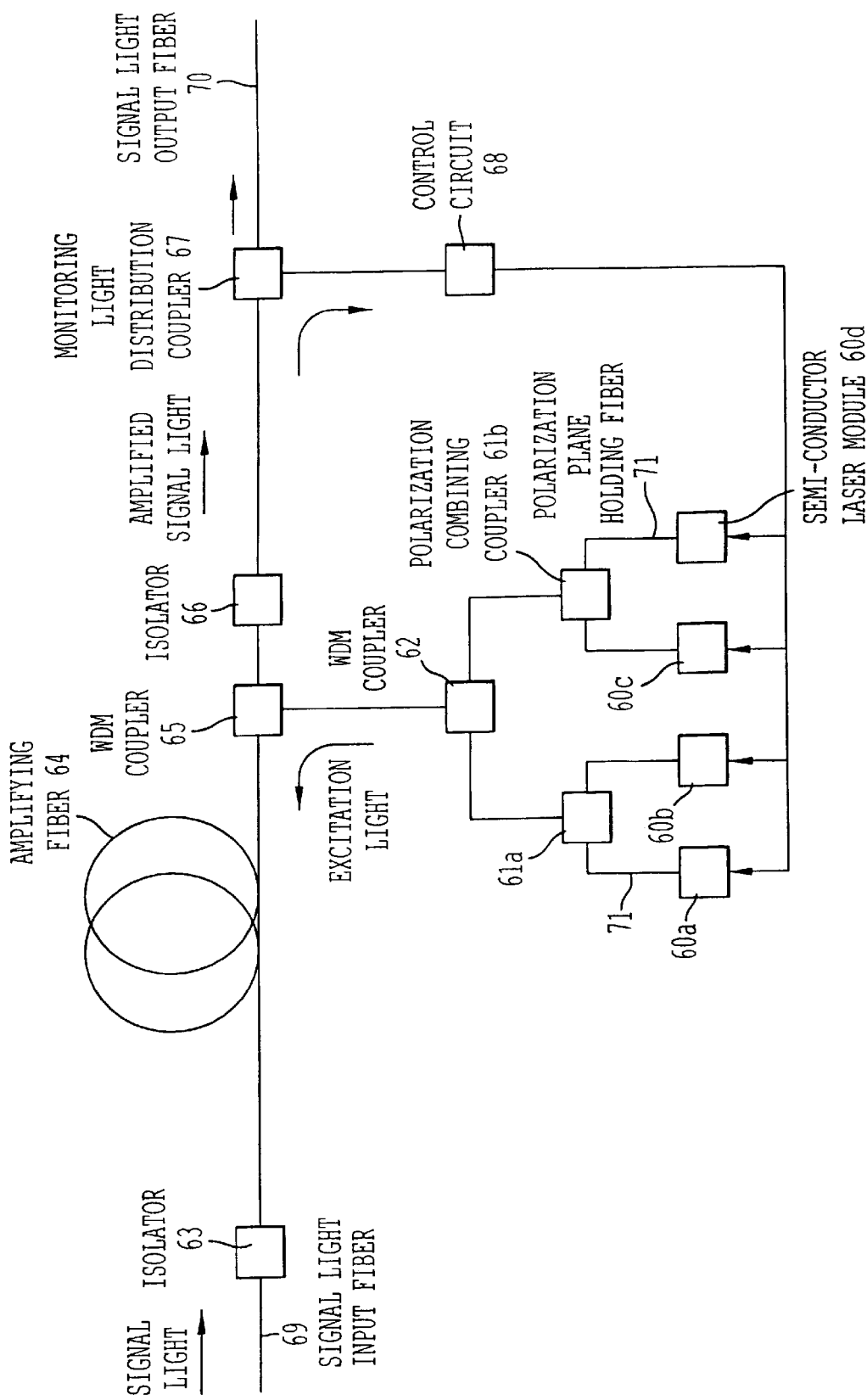
FIG. 12 is a block diagram illustrating a configuration of a Raman amplifier in which polarization dependency is canceled by polarization-multiplexing of pumping light beams output from two semiconductor laser devices, in accordance with an embodiment of the present invention.
Figure 13:
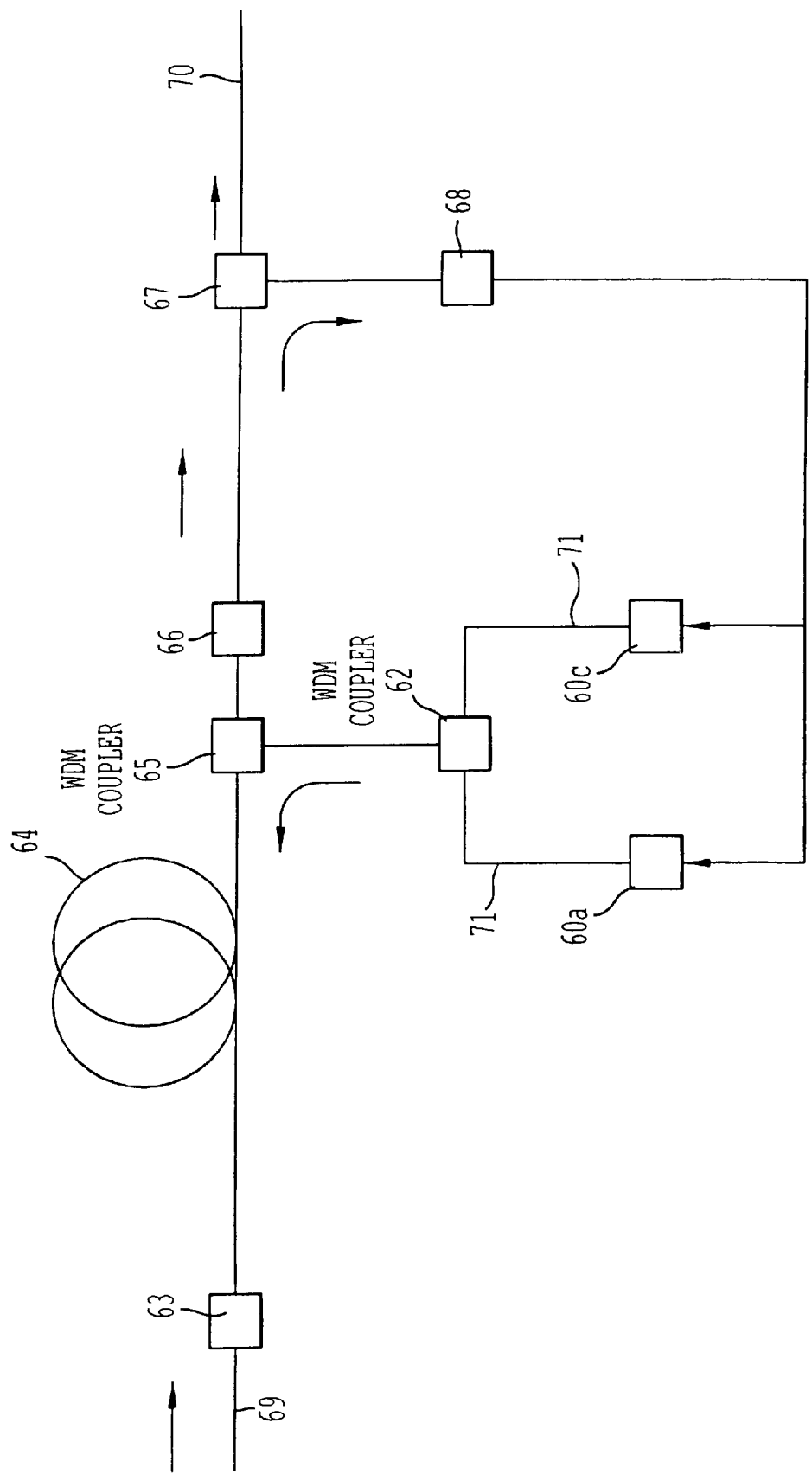
FIG. 13 is a block diagram illustrating a configuration of a Raman amplifier in which polarization dependency is canceled by depolarizing a pumping light beam output from a single semiconductor laser device using polarization maintaining fibers as a depolarizer, in accordance with an embodiment of the present invention.

Moreover, the present inventors have recognized that the number of longitudinal modes included in the predetermined spectral width w should be at least three, as shown by modes 31, 32, and 33 of FIG. 4. As discussed above, Raman amplification systems using a forward pumping method presents a problem in the resulting gain is dependent on the polarization of the incident pumping light. This dependency is canceled by performing polarization-multiplexing of pumping light beams output from two of the semiconductor laser devices 20, or by depolarizing a pumping light beam output from a single semiconductor laser device using polarization maintaining fibers as a depolarizer (these alternative embodiments are shown in FIGS. 12 and 13 respectively which will be further described below). In the latter case, the angle of the polarization axis of the polarization maintaining fiber against the emitted light from semiconductor laser device is approximately 45 degrees. With this configuration, an output of the laser device having a single polarization can obtain a random polarization by propagating a minimum distance through a polarization maintaining fiber. In general, the more the number of the oscillation longitudinal modes is increased, the shorter the length of the polarization maintaining fiber can be. Particularly, when the number of the oscillation longitudinal modes is more than three, preferably four or five, the coherence length of the laser light becomes shorter and the length of polarization maintaining fiber necessary for depolarizing the laser light becomes markedly short. Thus, it becomes easier to obtain a laser light of low degree of polarization (DOP) which is spectral for reducing the polarization dependency of a Raman amplifier, making it more feasible to replace 2 laser modules which are polarization-multiplexed with a single laser module with higher power and to thereby reduce the cost of lasers as well as polarization maintaining fibers.

In order to achieve the desired plurality of oscillation modes within the predetermined spectral width of the oscillation profile, the present inventors have recognized that the predetermined spectral width w and/or the wavelength interval $\Delta\lambda$ may be manipulated. However, a Raman amplification system poses limits on the values of the wavelength interval $\Delta\lambda$ and predetermined spectral width w of the oscillation wavelength spectrum 30. With regard to the wavelength interval $\Delta\lambda$, the present inventors have determined that this value should 0.1 nm or more as shown in FIG. 4. This is because, in a case in which the semiconductor laser device 20 is used as a pumping light source of the Raman amplifier, if the wavelength interval $\Delta\lambda$ is 0.1 nm or more, it is unlikely that the stimulated Brillouin scattering is generated. With regard to the predetermined spectral width w of the oscillation wavelength profile 30, if the predetermined spectral width of the oscillation wavelength is too wide, the coupling loss by a wavelength-multiplexing coupler becomes larger. Moreover, a noise and a gain variation are generated due to the fluctuation of the wavelength within the spectrum width of the oscillation wavelength. Therefore, the present inventors have determined that the predetermined spectral width w of the oscillation wavelength spectrum 30 should be 3 nm or less as shown in FIG. 4, and is preferably 2 nm or less.

In general, a wavelength interval $\Delta\lambda$ of the longitudinal modes generated by a resonator of a semiconductor device can be represented by the following equation:

$$\Delta\lambda = \lambda_0^2/(2 \cdot n \cdot L),$$

where n is the effective refractive index, $\lambda_0$ is the oscillation wavelength, and L is a length of the resonator defined by the reflection coating 14 and antireflection coating 15 as discussed with respect to FIGS. 1–3 above. From this equation it is seen that, neglecting refractive index n which has only a marginal affect on $\Delta\lambda$, the longer the resonator length is, the narrower the wavelength interval $\Delta\lambda$ becomes, and selection conditions for oscillating a laser beam of the signal longitudinal mode becomes stricter. However, in order to provide the desired plurality of longitudinal modes within a predetermined spectral width w of 3 nm or less, the resonator length L cannot be made too short. For example, in the diffraction grating device of FIGS. 1–3 where the oscillation wavelength $\lambda_0$ is 1480 nm and the effective refractive index is 3.5, the wavelength interval $\Delta\lambda$ of the longitudinal mode is approximately 0.39 nm when the resonator length is 800 $\mu$m. When the resonator length is 800 $\mu$m or more, it is easy to obtain a plurality of operating modes and higher output power. However, the resonator length L must not be made so long that the required wavelength interval of 0.1 nm cannot be achieved. Returning to the example of FIGS. 1–3 when the resonator length is 3200 $\mu$m, the wavelength interval $\Delta\lambda$ of the longitudinal mode is approximately 0.1 nm.

Thus, for a semiconductor laser device having an oscillation wavelength $\lambda_0$ of 1100 nm to 1550 nm, and in particular 1480 nm, and an effective refractive index of 3.5, the resonator cavity length L must be approximately within the range of 800 to 3200 $\mu$m as indicated in FIG. 2. It is noted that an integrated diffraction grating semiconductor laser device having such a resonator length L was not used in the conventional semiconductor laser devices because single longitudinal mode oscillation is difficult when the resonator length L is 800 $\mu$m or more. However, the semiconductor laser device 20 of the present invention, is intentionally made to provide a laser output with a plurality of oscillation longitudinal modes included within the predetermined spectral width w of the oscillation wavelength spectrum by actively making the resonator length L 800 $\mu$m or more. In addition, a laser diode with such a long resonator length is suitable to get high output power.

The objective of providing a plurality of operating modes within a predetermined spectral width w of the oscillation profile 30 may also be achieved by widening the predetermined spectral width w of the oscillation profile 30. In general, the predetermined spectral width w of the oscillation wavelength spectrum 30 is varied by changing a coupling coefficient κi and/or a grating length Lg of the diffraction grating. Specifically, assuming a fixed coupling coefficient κi and a predetermined spectral width w defined by the FWHM points, where the grating length Lg of the resonator is decreased, the predetermined spectral width w is increased thereby allowing a greater number of longitudinal modes to occupy the predetermined spectral width w as laser operating modes. In this regard, it is noted that conventional integrated grating devices used only a full length grating structure. This is because these conventional devices provided only single mode operation in which it was undesirable to increase predetermined spectral width. The present inventors have discovered that shortening the grating is useful in providing multiple mode operation.

As described above, a laser device to be used as an excitation source for a Raman amplifier should contain a plurality of oscillation longitudinal modes within a predetermined spectral width w of the laser device's wavelength oscillation profile. Methods and devices for providing a plurality of oscillation longitudinal modes within a predetermined spectral width w of the laser device's wavelength oscillation profile are disclosed in U.S. patent application Ser. No. 09/832,885 filed on Apr. 12, 2001, the entire contents of which are incorporated herein by reference. The objective of providing multiple oscillation modes within a predetermined width is generally achieved by adjusting the device cavity length to manipulate the wavelength interval and adjusting the coupling coefficient and/or grating length to manipulate the spectral width. However, the present inventors have discovered that where a shortened diffraction grating is placed on the reflective coating side of the laser device as shown in FIGS. 1–3, the relationship between the diffraction grating length Lgr and the coupling coefficient κi has particular importance in obtaining a plurality of stable oscillation modes.

First, the present inventors recognized that a plurality of stable oscillation modes can be obtained where a nearly flat oscillation threshold gain is achieved by the laser device. The threshold gain is a gain necessary for oscillating; the lower the threshold gain is, the easier it is for oscillation, and the higher the threshold gain, the less easier is the oscillation. FIG. 5 is a diagram showing the relation of oscillation wavelength and threshold gain of the semiconductor laser device shown in FIG. 1 to FIG. 3. Each plot in FIG. 5 represents a wavelength mode of the laser device. Where the corresponding threshold gain for a wavelength mode is relatively low, the possibility of oscillation for that mode is high. Thus, FIG. 5 includes plots P1 to P4 of four wavelength modes that are lower in the threshold gain as compared with other plots, and therefore produce four oscillation longitudinal modes. Where the corresponding threshold gain for a wavelength mode is relatively high, the possibility of oscillation for that mode is low. Thus, the wavelength modes other than P1, P2, P3, and P4 in FIG. 5 each have a relatively high threshold gain and therefore result in non-oscillation modes. It is noted that the term "non-oscillation modes" is intended to indicate that the wavelength modes do not have large gain in order to oscillate.

As shown in FIG. 5, plots P1 to P4 of the oscillation modes are formed near the Bragg wavelength 1480 nm corresponding to period 220 nm of the diffraction grating 13a. As seen in the figure, the value Δb represents the threshold gain difference between the oscillation mode P2 having the least threshold gain and the oscillation mode P4 having the greatest threshold gain. That is, each oscillation mode plot P1–P4 has a threshold gain difference from other oscillation mode plots of less than Δb. On the other hand, the value Δa represents the threshold gain difference between the oscillation mode P4 having the greatest threshold gain of the oscillation modes P1–P4, and the non-oscillation mode having the least threshold gain among the non-oscillation modes.

The present inventors have recognized that in order to provide a plurality of stable oscillation modes the threshold gain difference Δa between oscillation longitudinal mode and non-oscillation longitudinal mode is preferred to be larger. That is, if the threshold gain difference Δa between oscillation longitudinal mode and non-oscillation longitudinal mode is small, as the injection current increases, oscillation begins and the oscillation spectrum width becomes broader, and the optical output characteristic may kink due to a mode hopping caused by generation of a new mode. On the other hand, the threshold gain difference Δb between oscillation longitudinal modes is preferred to be smaller. That is, when the threshold gain difference Δb is small, each oscillation longitudinal mode oscillates always in the same condition.

Figure 6:
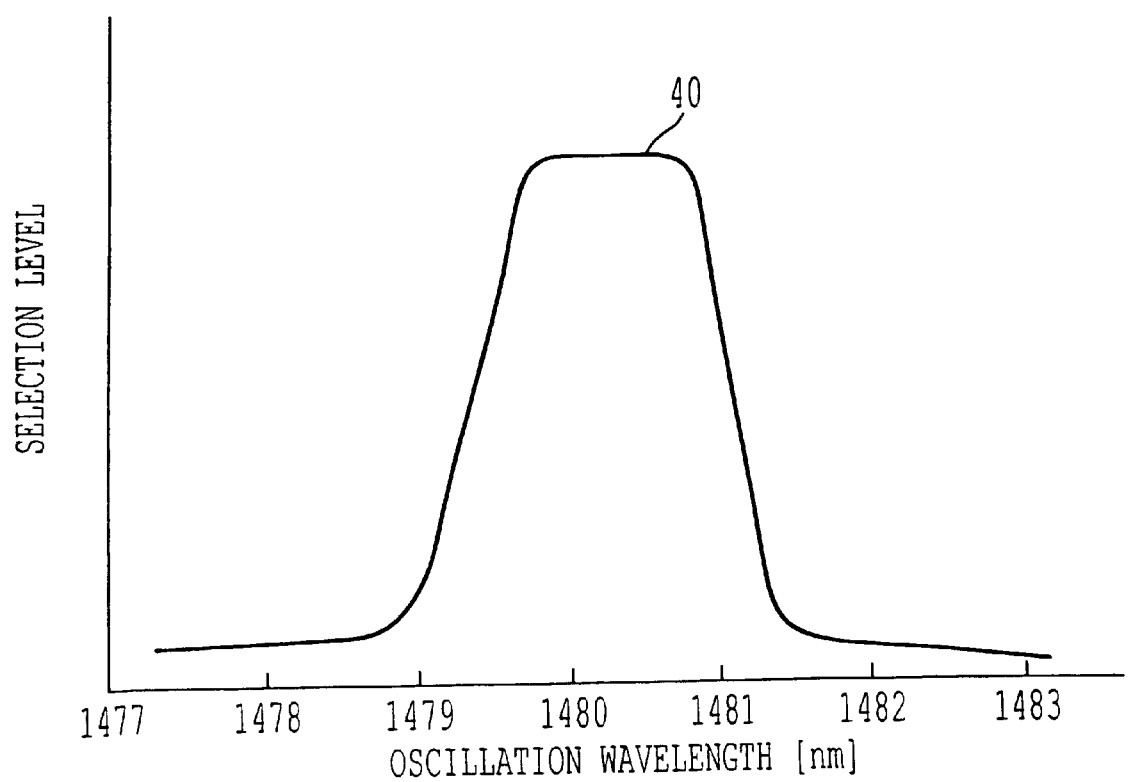
FIG. 6 is a diagram showing the selection level characteristic relating to the oscillation wavelength spectrum of a device in accordance with the present invention.

More specifically, the present inventors have discovered that a Δa value 1.5 cm$^{-1}$ or more, and a Δb value of 1 cm$^{-1}$ or less will ensure that the plurality of oscillation longitudinal modes oscillate at nearly the same level and a stable output is provided. Moreover, these values will ensure a high level of selectivity among oscillation and non-oscillation modes. FIG. 6 is a diagram showing the selection level characteristic relating to the oscillation wavelength spectrum by the diffraction grating 13a. Characteristic 40 shown in FIG. 6 shows the characteristic of the selection level relating to the oscillation wavelength in the case of setting of characteristic of threshold gain relating to the oscillation wavelength as shown in FIG. 5. The characteristic selection level of the oscillation wavelength is a flat and high selection level in a band of 2 nm, centered at 1480 nm. The present inventors have conducted several experiments to determine the impact of coupling coefficient κi and the diffraction grating length Lgr on obtaining the high and flat selection level curve of FIG. 6.

Figure 7A:
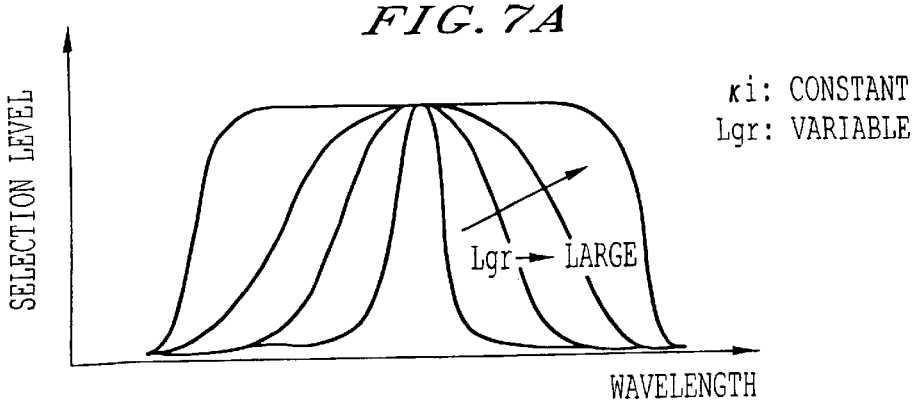
FIGS. 7A–7C are graphs showing the selection level characteristics of an oscillation wavelength spectrum under various coupling coefficients and diffraction grating lengths.
Figure 7B:
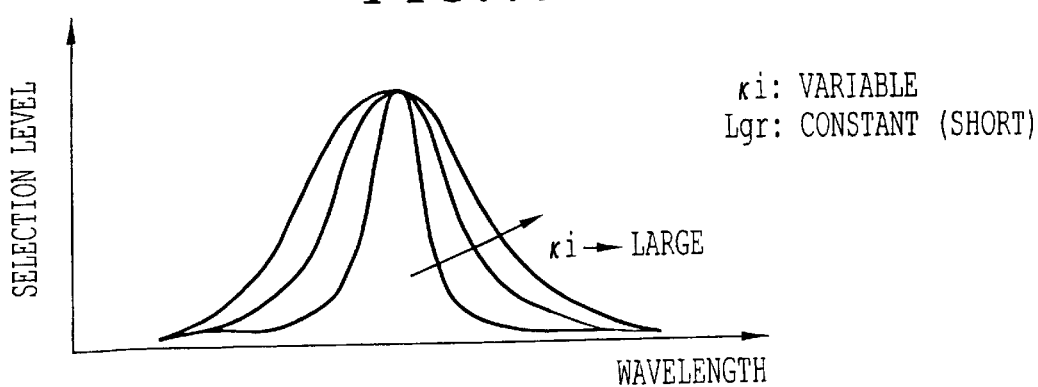
Figure 7C:
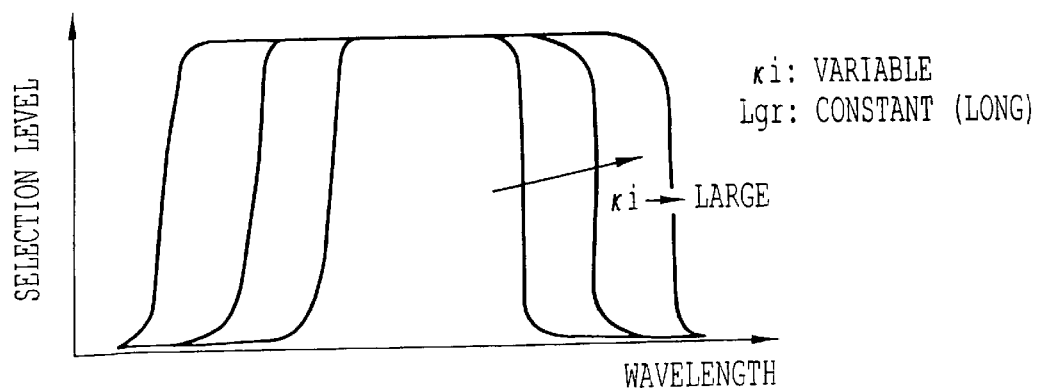

Specifically, FIGS. 7A–7C are graphs showing the selection level characteristics of an oscillation wavelength spectrum under various coupling coefficients κi and diffraction grating lengths Lgr. FIG. 7A is a graph showing the changes in wavelength oscillation profile where the coupling coefficient κi is held constant and the diffraction grating Lgr is changed from a small value to a large value. As seen in this figure, the oscillation wavelength spectrum showing the selection level relating to the oscillation wavelength shows a steep hill profile of a relatively narrow spectrum width when the diffraction grating length Lgr is small. However, as the grating length Lgr is increased, the wavelength oscillation profile is swollen until the final selection level is a high and flat characteristic as also shown.

FIG. 7B is a graph showing the changes in wavelength oscillation profile where the diffraction grating length Lgr is held to a relatively short length of about 100 μm, for example, while the coupling coefficient κi is changed from a small value to a large value. As seen in the figure, where the coupling coefficient κi is a small value, a steep hill profile of a relatively narrow spectrum width is achieved. However, as the coupling coefficient κi is increased, the entire hill profile is swollen without formation of high selection level. In contrast, FIG. 7C is a graph showing the changes in wavelength oscillation profile where the diffraction grating Lgr is held to a relatively long length of about 500 μm, for example, while the coupling coefficient κi is changed from a small value to a large value. Where κi is a small value in FIG. 7C, the spectrum width is relatively narrow with a high and flat selection level. Moreover, as the coupling coefficient κi is increased, spectrum width is broadened while maintaining its high flat selectivity characteristic.

Based on the results represented in FIGS. 7A–7C, the present inventors determined that by setting the diffraction grating length Lgr to 500 μm and the coupling coefficient κi to 40 cm$^{-1}$, a flat and high selectivity characteristic oscillation wavelength selection curve having a width of 2 nm is achieved. That is, where the the product of the diffraction grating length Lgr and the coupling coefficient κi is κi*Lg=2, the desired selectivity of the oscillation curve can be achieved. Moreover, by setting the product of the diffraction grating length Lgr and the coupling coefficient κi at κi*Lg≧2, two or more oscillation longitudinal modes can be maintained at nearly the same oscillation level.

Figure 8:
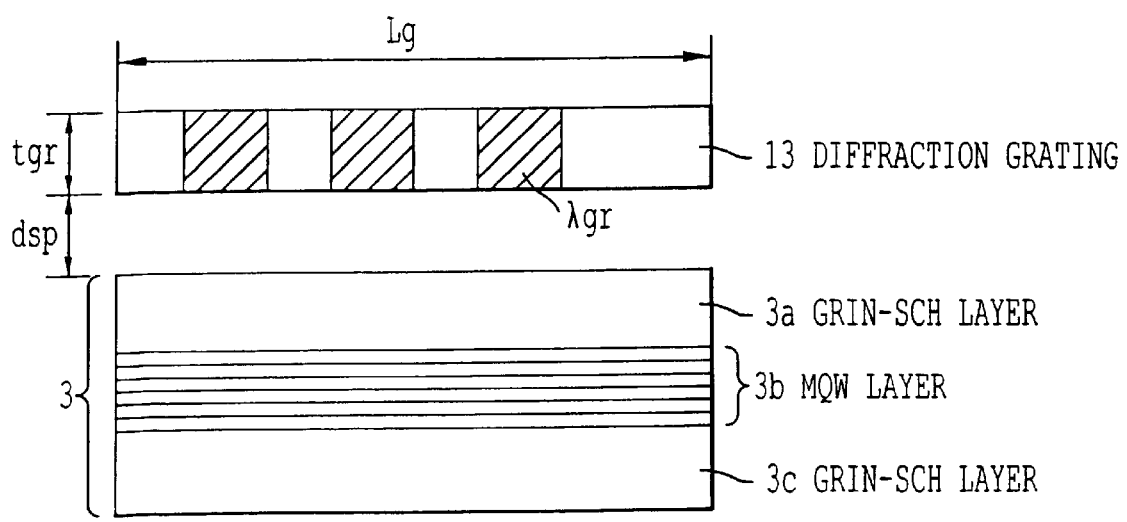
FIG. 8 is a diagram showing various physical parameters of a semiconductor laser device according to the present invention.

FIG. 8 shows various physical parameters of a semiconductor laser device according to the present invention. The figure shows a layout relationship between the GRIN-SCH-MQW active layer 3 and the diffraction grating 13, with the GRIN-SCH-MQW active layer 3 having a construction in which the MQW layer 3b is sandwiched by the GRIN-SCH layers 3a and 3c. As seen in FIG. 8, the length of the diffraction grating 13 is represented by "Lg" (μm), the thickness of the diffraction grating is represented by "tgr" (nm), and the distance between the diffraction grating 13 and the GRIN-SCH layer 3a is represented by "dsp" (nm). In addition, "λgr" (μm) represents the diffraction grating composition wavelength, which corresponds to the band gap energy of a material forming the diffraction grating 13. The present inventors have recognized that the parameters tgr, λgr, and dsp affect the coupling coefficient value κi of a device according to the present invention. Thus, by changing these physical parameters and the length Lg, a κi*Lg value of 2 or more can be achieved.

Aside from the diffraction grating length Lgr being an important factor in providing a flat and highly selective oscillation wavelength spectrum, the present inventors have also realized that the parameter κi is important to determining the output level of the laser. Specifically, the present inventors have discovered that despite the improved selectivity of a relatively large Lgr value as discussed with respect to FIG. 7C, where the diffraction grating 13a extends into the light emitting side of the laser device, the reflectivity of the grating decreases thereby decreasing the light output at the light emission side of the laser device. That is, to improve reflective properties of the diffraction grating 13a placed on the light reflecting side, the diffraction grating should be kept to no more than ½ of the resonator length L. Thus, the present inventors have discovered that, to optimize selectivity of the wavelength oscillation spectrum while also maintaining output efficiency, the diffraction grating 13a should be approximately equal to ½ the resonator length L.

In addition to controlling the grating length Lgr of the grating 13a to improve light output efficiency of the device, the present inventors have determined that placing a diffraction grating 13b on the side of the light emission facet of the laser device even further improves the light output of the laser device 20. Specifically, where the exit side reflective film 15 has the reflectivity of 5% as mentioned above, the diffraction grating 13b is not needed. However, the diffraction grating 13b may be provided in order to guarantee that at least part of the laser beam may be returned to the resonator at the exit side. In this regard, the length Lgf of the diffraction grating 13b is enough as far as the diffraction grating 13b is present, and it is provided at the exit side as far as possible so that the reflectivity due to the diffraction grating 13b may be lower. The present inventors have discovered that in a device having diffraction gratings 13a and 13b, the output of the laser beam emitted from the reflective film 15 side has a value of 20 or more as compared with the output of the laser beam emitted from the rear reflective film 14. Thus, a semiconductor laser device of high laser beam output efficiency is realized.

Figure 9:
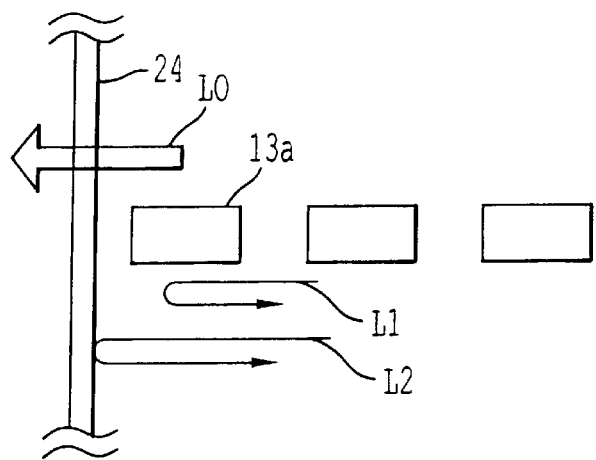
FIG. 9 is a sectional view at the reflective film side of a semiconductor laser device according to an embodiment of the present invention.

As yet another means of improving light output efficiency, the present inventors have realized that the reflective value of the reflective film 14 affects the light output efficiency of a laser device having a partial diffraction grating on the light reflecting side of the device. FIG. 9 is a sectional view at the reflective film side of a semiconductor laser device according to an embodiment of the present invention. The laser device includes a partial diffraction grating 13a on the light reflecting side as described with respect to FIGS. 1–3, and a reflective film 24 similar to the reflective film 14 of FIGS. 1–3. As discussed above, the grating 13a and the film 24 provide reflection of the laser light generated by the active layer of the device. Thus, as shown in FIG. 9, a portion of the light within the resonator of the laser device 20 is reflected by the grating 13a as "L1," with the remaining portion of the light reaching the film 24. Of the light reaching the film 24, a portion "L2" is reflected back into the resonator by the film 24, and a portion "LO" exits the film 24 to the exterior of the laser device.

Where the reflecting film is 80% or more as described in FIGS. 1–3 above, most of the light reaching the reflective film will be reflected back into the cavity of the laser device as light portion L2. This light L2 may be either in phase or out of phase with the light L1 reflected by the grating 13a. Where the light L2 is in phase with the light L1, no problem occurs; however, where L1 and L2 are out of phase, the laser beam L1 is attenuated by the light L2 to an extent depending on the phase deviation between these signals. For example, where the lights L1 and L2 are exactly opposite phase, the light L2 will cancel a portion of the light L1.

Whether the light portions L1 and L2 are in phase is determined by a cleaving position of the laser device. The cleavage is formed when a plurality of semiconductor laser devices formed in a matrix shape on a semiconductor substrate such as a wafer are cut into individual laser devices. The wafer is first cut into strips, or laser bars, which form a series of semiconductor devices that have their sides in the length direction aligned adjacent to each other. The cleavage occurs when the laser bar is cut into individual laser devices. When the cleavage is made at accurate cleavage positions, the light L2 is caused to be in phase with the light L1. However, when the cleavage position is shifted from the accurate cleavage position, the light L2 will be out of phase with the light L1. However, the cleavage position cannot be easily controlled with the result that the cutting position often causes out of phase reduction in the light to be emitted by the laser device. This results in inferior laser devices which may be scrapped. Thus, in order to provide high yield in the manufacture of such devices, complicated high precision cleaving must be performed.

The present inventors have recognized that with a device having the diffraction grating on the reflective side of the device, most of the light within the resonator is reflected by the grating 13a. This is particularly true where the grating 13a is not more than ½ L as described above. Therefore, in reflective side grating devices, the reflective properties of the reflective film 24 is not needed to keep most of the light within the resonator. Thus, it is desirable to lower the reflectivity property of the film 24 so that light L2 which may result in out of phase losses is allowed to escape the device as light LO. Specifically, according to the present invention, the reflectivity of film 24 is preferably 5% or less. That is, of the light reaching the film 24, 95% of the light is allowed to escape as light LO and only 5% of the light is reflected as light L2. Thus, if a reflected light of reverse phase is caused due to cleavage position, a drop of laser beam output is negligible and a stable laser output can be obtained. In this regard, it may be contemplated that the reflective film 24 is not necessary at all. However, the reflectivity of an uncoated cleavage side is generally high. Therefore, the output from the reflective film 24 to outside is securely realized by coating with the reflective film 24 at a low reflectivity of 5% or less.

Figure 10:
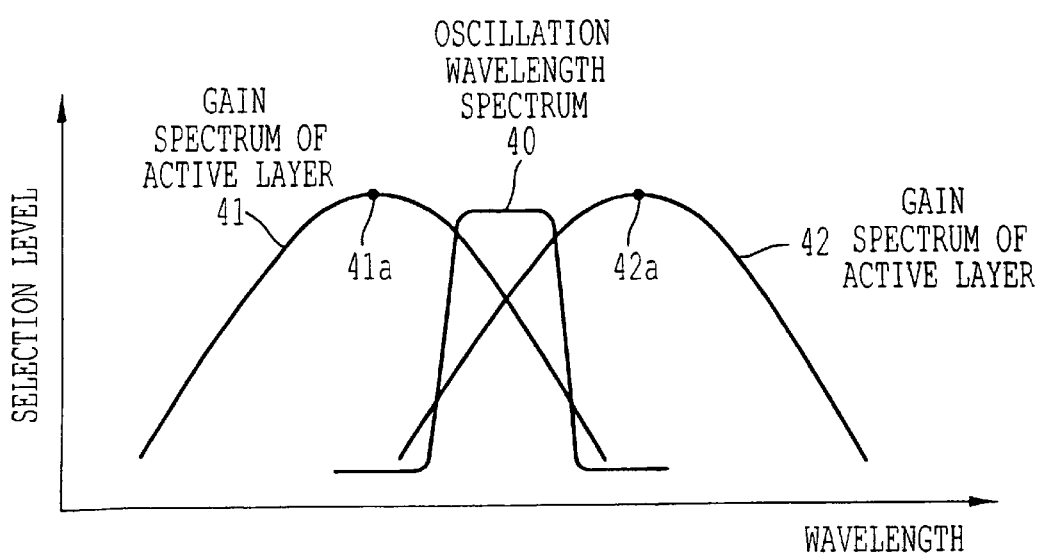
FIG. 10 is a diagram illustrating the concept of setting the wavelength oscillation spectrum in relation to the gain spectrum of the active layer in accordance with an embodiment of the present invention.

In the embodiments of the invention previously described, a static characteristic of the gain spectrum of the active layer has been assumed. In the case of actual laser oscillation, however, the gain spectrum of the active layer 3 generally moves to a longer wavelength with an increase in driving current. The present inventors have determined that this dynamic characteristic of the gain spectrum of the active layer may be used to provide a laser device having specific characteristics for a given device application. FIG. 10 is a diagram illustrating the concept of setting the wavelength oscillation spectrum in relation to the gain spectrum of the active layer in order to obtain a laser device having characteristics for a specific device application. As seen in this figure, the graph includes an oscillation wavelength spectrum 40, a gain spectrum 41 having a peak gain wavelength 41a, and a gain spectrum 42 having a peak gain wavelength 42a. The gain spectrums 41 and 42 represent the gain spectrum of an active layer in two different semiconductor devices.

In the case of the gain spectrum active layer 41, as indicated above, this gain spectrum 41 is shifted to the longer wavelength side, by about several nanometers, along with an increase of the driving current. However, the oscillation wavelength spectrum 40 of the diffraction grating 13a is set at the longer wavelength side as compared with the peak wavelength 41 a of the gain spectrum 41. Therefore, as the driving current increases, the peak wavelength 41a is taken into the oscillation wavelength spectrum 40, so that a stable laser output of high output is obtained.

When the gain spectrum determined by the active layer 3 itself is gain spectrum 42, this gain spectrum 42 is also shifted to the longer wavelength side, by about several nanometers along with the increase of the driving current. However, in this case, the oscillation wavelength spectrum 40 of the diffraction grating 13a is set at the shorter wavelength side as compared with the peak wavelength 42a of the gain spectrum 42. Therefore, as the driving current is increased, peak wavelength 42a is moved outside of the oscillation wavelength spectrum 40 thereby increasing the differential gain of the laser device. This increase in differential gain decreases the relative intensity noise (RIN) so that a laser beam of low noise level can be produced. Another reason about low RIN is as follows. According to the iGM, an isolation can be set in a package of a LD module. Then the isolation can be located near the LD.

Therefore, where a stabilized high output laser beam is needed, the oscillation wavelength spectrum 40 should be set at the longer wavelength side of the gain spectrum of the active layer itself, and where laser beam of low noise level is required, the oscillation wavelength spectrum 40 should be set at the shorter wavelength side of the gain spectrum of the active layer itself. This process of setting the oscillation wavelength spectrum 40 in relation to the peak wavelength of the gain spectrum of the active layer is achieved by adjusting the pitch of the partial grating. That is, by adjusting the pitch of the grating elements of the diffraction grating 13a, the center wavelength of the oscillation wavelength spectrum 40 can be set to a desired wavelength.

Figure 11:
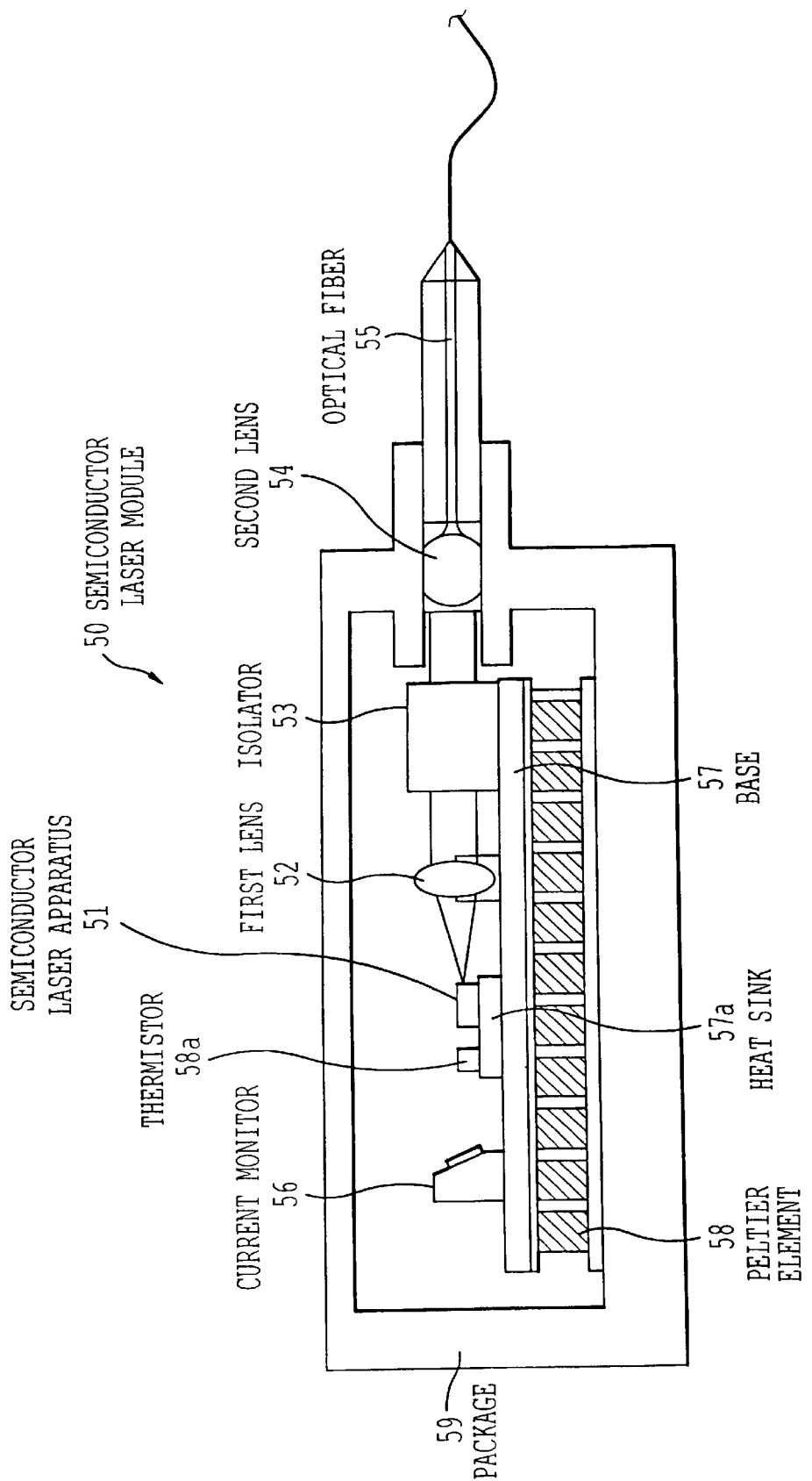
FIG. 11 is a vertical sectional view illustrating a configuration of a semiconductor laser module in accordance with the present invention.

FIG. 11 is a vertical sectional view illustrating the configuration of a semiconductor laser module having a semiconductor laser device according to the present invention. The semiconductor laser module 50 includes a semiconductor laser device 51, a first lens 52, an internal isolator 53, a second lens 54 and an optical fiber 55. Semiconductor laser device 51 is an integrated grating device configured in accordance with any of the above-described semiconductor laser devices and a laser beam irradiated from the semiconductor laser device 51 is guided to optical fiber 55 via first lens 52, internal isolator 53, and second lens 54. The second lens 54 is provided on the optical axis of the laser beam and is optically coupled with the optical fiber 55.

The present inventors have recognized that, in the semiconductor laser module 50 having the semiconductor laser device 51 of the present invention, since the diffraction grating is formed inside the semiconductor laser device 51, internal isolator 53 can be intervened between the semiconductor laser device 51 and the optical fiber 55. This provides an advantage in that reflected return light beams by other optical parts or from the external of the semiconductor laser nodule 50 are not re-inputted in the resonator of the laser device 51. Thus, the oscillation of the semiconductor laser device 51 can be stable even in the presence of reflection from outside. Moreover, placing the internal isolator 53 between the laser device 51 and optical fiber 55 does not introduce loss to the laser module. As is known in the art, the loss of an isolator is primarily in the area of a collecting lens which focuses the light beam onto a fiber at the output of the isolator material. The loss is caused by the coupling between this output lens and an output optical fiber. However, by using an internal isolator 53, the second lens 54 of the laser module 50 provides the function of the output lens of the isolator. Since the second lens 54 is necessary to the laser module 50 even without the internal isolator, the internal isolator 53 does not introduce any power loss into the laser module 50. In fact, use of the internal isolator reduces the loss of Raman amplifier system as will be further described below. Another advantage provided by the Internal isolator 53 is that it provides stable isolation characteristics. More specifically, since internal isolator 53 is in contact with the Peltier module 58, the internal isolator 53 is held at a constant temperature and therefore does not have the fluctuating isolation characteristics of an external isolator which is typically at ambient temperature.

A back face monitor photo diode 56 is disposed on a base 57 which functions as a heat sink and is attached to a temperature control device 58 mounted on the metal package 59 of the laser module 50. The back face monitor photo diode 56 detects a light leakage from the reflection coating side of the semiconductor laser device 51. The temperature control device 58 is a Peltier module. Although current (not shown) is given to the Peltier module 58 to perform cooling and heating by its polarity, the Peltier module 58 functions mainly as a cooler in order to prevent an oscillation wavelength shift by the increase of temperature of the semiconductor laser device 51. That is, if a laser beam has a longer wavelength compared with a desired wavelength, the Peltier element 58 cools the semiconductor laser device 51 and controls it at a low temperature, and if a laser beam has a shorter wavelength compared with a desired wavelength, the Peltier element 58 heats the semiconductor laser device 51 and controls it at a high temperature. By performing such a temperature control, the wavelength stability of the semiconductor laser device can be improved. Alternatively, a thermistor 58a can be used to control the characteristics of the laser device. If the temperature of the laser device measured by a thermistor 58a located in the vicinity of the laser device 51 is higher, the Peltier module 58 cools the semiconductor laser device 51, and if the temperature is lower, the Peltier module 58 heats the semiconductor laser device 51. By performing such a temperature control, the wavelength and the output power intensity of the semiconductor laser device are stabilized.

Yet another advantage of the laser module 50 using the integrated laser device according to the present invention 15 that the Peltier module can be used to control the oscillation wavelength of the laser device. As described above, the wavelength selection characteristic of a diffraction grating is dependant on temperature, with the diffraction grating integrated in the semiconductor laser device in accordance with the present invention, the Peltier module 58 can be used to actively control the temperature of the grating and, therefore, the oscillation wavelength of the laser device.

FIG. 12 is a block diagram illustrating a configuration of a Raman amplifier used in a WDM communication system in accordance with the present invention. In FIG. 12, semiconductor laser modules 60a through 60d are of the type described in the embodiment of FIG. 11. The laser modules 60a and 60b output laser beams having the same wavelength via polarization maintaining fiber 71 to polarization-multiplexing coupler. Similarly, laser beams outputted by each of the semiconductor laser modules 60c and 60d have the same wavelength, and they are polarization-multiplexed by the polarization-multiplexing coupler 61b. Each of the laser modules 60a through 60d outputs a laser beam having a plurality of oscillation longitudinal modes in accordance with the present invention to a respective polarization-multiplexing coupler 61a and 61b via a polarization maintaining fiber 71.

Polarization-multiplexing couplers 61a and 61b output polarization-multiplexed laser beams having different wavelengths to a WDM coupler 62. The WDM coupler 62 multiplexes the laser beams outputted from the polarization multiplexing couplers 61a and 61b, and outputs the multiplexed light beams as a pumping light beam to amplifying fiber 64 via WDM coupler 65. Thus, as seen in FIG. 12, a Raman amplifier using a laser module in accordance with the present invention does not include an external isolator such as isolator 60 of FIG. 16. Therefore, the loss associated with the external isolator, as discussed above, is eliminated from the Raman amplifier system of FIG. 12. Signal light beams to be amplified are input to amplifying fiber 64 from signal light inputting fiber 69 via polarization-independent isolator 63. The amplified signal light beams are Raman-amplified by being multiplexed with the pumping light beams and input to a monitor light branching coupler 67 via the WDM coupler 65 and the polarization-independent isolator 66. The monitor light branching coupler 67 outputs a portion of the amplified signal light beams to a control circuit 68, and the remaining amplified signal light beams as an output laser beam to signal light outputting fiber 70.

The control circuit 68 controls a light-emitting state, for example, an optical intensity, of each of the semiconductor light-emitting elements 180a through 180d based on the portion of the amplified signal light beams input to the control circuit 68. Moreover, control circuit 68 performs feedback control of a gain band of the Raman amplification such that the gain band will be flat over wavelength.

The Raman amplifier described in FIG. 12 realizes all of the advantages of the semiconductor laser device as previously described. For example, although the Raman amplifier illustrated in FIG. 12 is the backward pumping method, since the semiconductor laser modules 60a through 60d output stable pumping light beams, a stable Raman amplification can be performed whether the Raman amplifier is the forward pumping method or the bi-directional pumping method.

The Raman amplifier can be constructed by wavelength-multiplexing of a plurality of pumping light which are not polarization-multiplexed. That is, the semiconductor laser module of the present invention can be used in a Raman amplifier where the polarization-multiplexing of pumping light is not performed. FIG. 13 is a block diagram illustrating a configuration of a Raman amplifier in which polarization dependency is canceled by depolarizing a pumping light beam output from a single semiconductor laser device using polarization maintaining fibers as a depolarizer, in accordance with an embodiment of the present invention. As seen in this figure, laser modules 60a and 60c are directly connected to WDM coupler 62 via a polarization maintaining fiber 71. In this configuration, the angle of the polarization axis of the polarization maintaining fiber against the emitted light from semiconductor laser device is approximately 45 degrees. As mentioned above, since at least 3 longitudinal modes are included in the predetermined spectral width of the output spectrum of the laser light, the coherence length of the laser light becomes shorter and the length of polarization maintaining fiber necessary for depolarizing the laser light becomes markedly short. Thus, it becomes easier to obtain a laser light of low degree of polarization (DOP) which is spectral for reducing the polarization dependency of a Raman amplifier. Therefore, the laser device of the present invention provides a further advantage in that it is possible to substitute 2 units of laser modules which are polarization-multiplexed (as shown in FIG. 12) for one unit of depolarized laser module of greater power (as shown in FIG. 13), without deteriorating DOP and while obtaining a corresponding reduction in costs.

Figure 14:
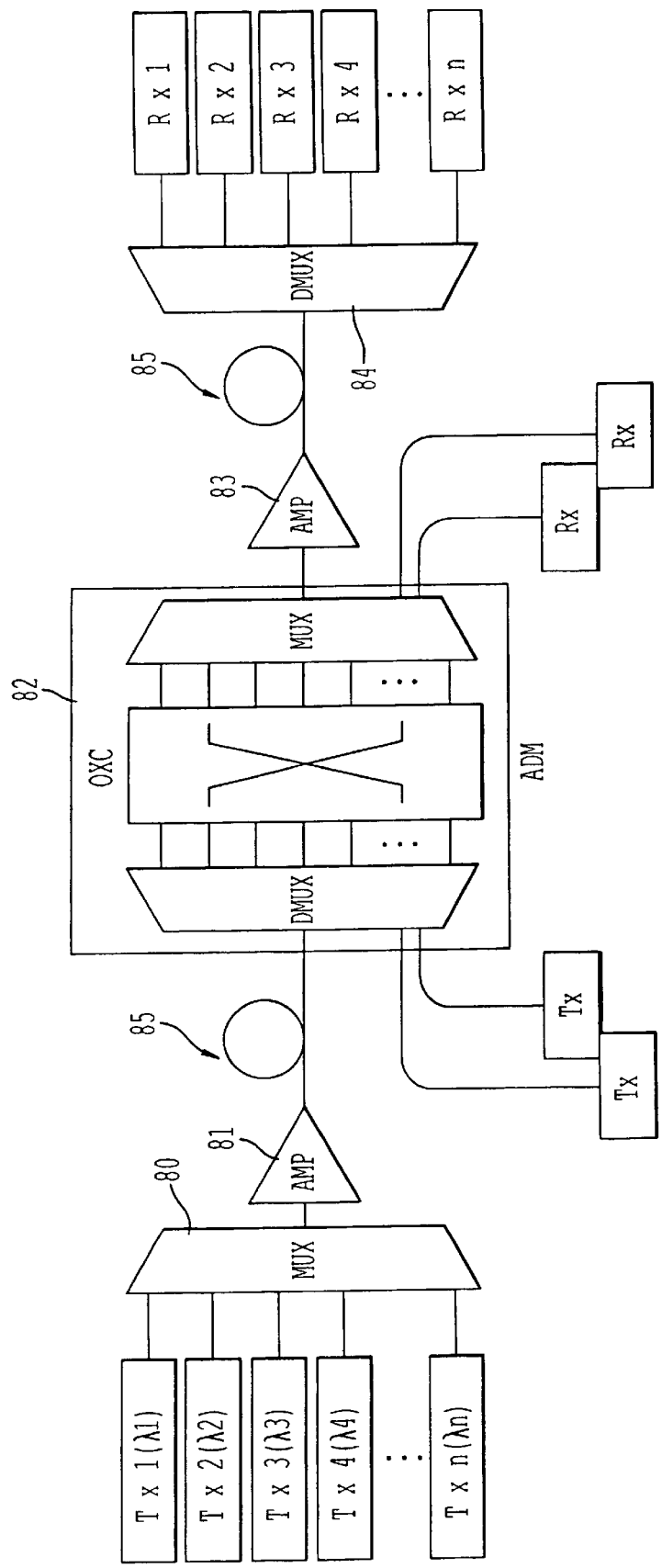
FIG. 14 is a block diagram illustrating a general configuration of a WDM communication system in which the Raman amplifier shown in FIG. 12 or 13 is used.
Figure 15A:
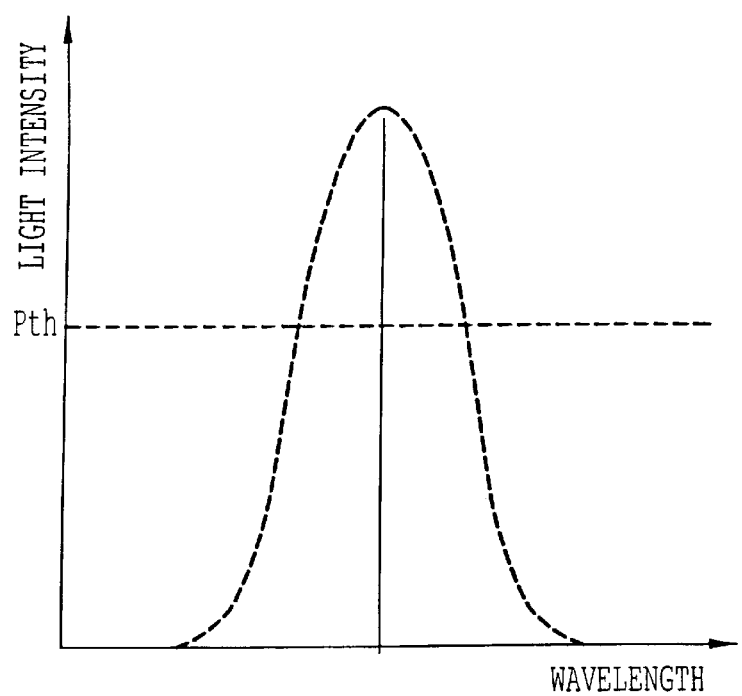
FIGS. 15A and 15B are graphs showing the relationship of laser beam output powers with respect to a single oscillation longitudinal mode and a plurality of oscillation longitudinal modes, and a threshold value of the stimulated Brillouin scattering.
Figure 15B:
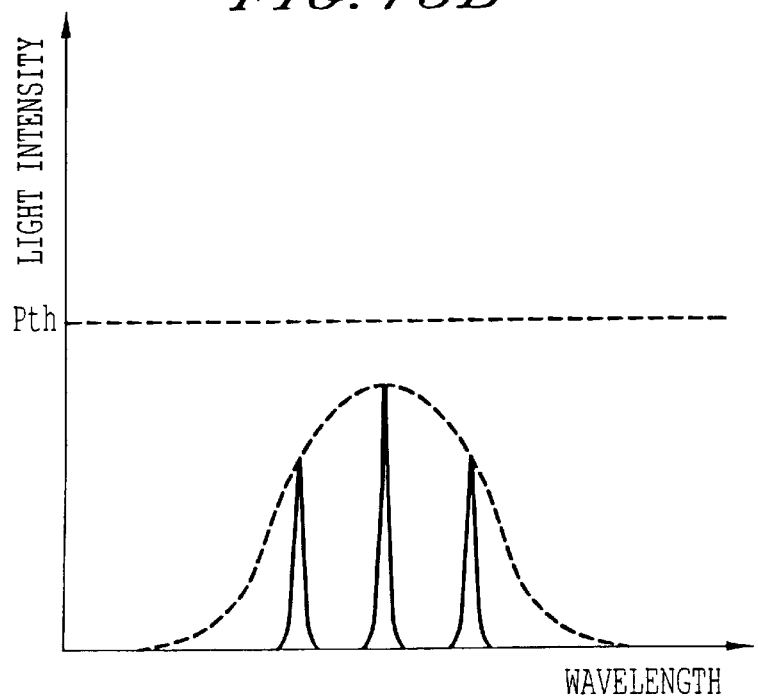

The Raman amplifier illustrated in FIGS. 12 and 13 can be applied to the WDM communication system as described above. FIG. 14 is a block diagram illustrating a general configuration of the WDM communication system to which the Raman amplifier shown in either FIG. 12 or FIG. 13 is applied.

In FIG. 14, optical signals of wavelengths $\lambda_1$ through $\lambda_n$ are forwarded from a plurality of transmitter $Tx_1$ through $Tx_n$ to multiplexing coupler 80 where they are wavelength-multiplexed and output to optical fiber 85 line for transmission to a remote communications unit. On a transmission route of the optical fiber 85, a plurality of Raman amplifiers 81 and 83 corresponding to the Raman amplifier illustrated in FIG. 11 are disposed amplifying an attenuated optical signal. A signal transmitted on the optical fiber 85 is divided by an optical demultiplexer 84 into optical signals of a plurality of wavelengths $\lambda_1$ through $\lambda_n$, which are received by a plurality of receivers $Rx_1$ through $Rx_n$. Further, an ADM (Add/Drop Multiplexer) may be inserted on the optical fiber 85 for inserting and removing an optical signal of an arbitrary wavelength.

Obviously, numerous modifications and variations of the present invention are possible in light of the above teachings. It is therefore to be understood that within the scope of the appended claims, the invention may be practiced otherwise than as specifically described herein. For example, the present invention has been described as a pumping light source for the Raman amplification, it is evident that the configuration is not limited to this usage and may be used as an EDFA pumping light source of the oscillation wavelength of 980 nm and 1480 nm. Moreover, while the identity of coupling coefficient of the diffraction gratings 13a, 13b has not been mentioned, it may be either same or different. When the coupling coefficients are same, the manufacturing process of semiconductor laser device is easier, and when the coupling coefficients are different, the degree of freedom of design is increased.

What is claimed is:

1. A semiconductor device comprising:
    an active layer configured to radiate light;
    a light reflecting facet positioned on a first side of said active layer;
    a light emitting facet positioned on a second side of said active layer thereby defining a resonator between said light reflecting facet and said light emitting facet; and
    a partial diffraction grating having a predetermined length, and integrated within the semiconductor laser device and positioned on a light reflecting side of said resonator, wherein
    said predetermined length of said partial diffraction grating is selected such that said semiconductor device emits a light beam having a plurality of longitudinal modes within a predetermined spectral width of an oscillation wavelength spectrum of the semiconductor device.

2. The semiconductor device of claim 1, wherein said light reflecting facet is configured to have a reflectivity of no more than 5%.

3. The semiconductor device of claim 1, wherein said light reflecting facet is configured to have a reflectivity of no less than 80%.

4. The semiconductor device of claim 1, wherein said light emitting facet is configured to have a reflectivity of no more than 5%.

5. The semiconductor device of claim 1, wherein said predetermined length of said partial diffraction grating is set in relation to a length of said resonant cavity.

6. The semiconductor device of claim 5, wherein said predetermined length of said partial diffraction grating is set to meet the inequality:

$$Lgr \leq \tfrac{1}{2} L,$$

where Lgr is the predetermined length of the partial diffraction grating in $\mu$m, and L is the length of the resonant cavity in $\mu$m.

7. The semiconductor device of claim 6, wherein said predetermined length of said partial diffraction grating is approximately ½ L.

8. The semiconductor device of claim 1, wherein said predetermined length of said partial diffraction grating is set in relation to a coupling coefficient of said diffraction grating.

9. The semiconductor device of claim 8, wherein said predetermined length of said partial diffraction grating is set to meet the inequality:

$$\kappa i \cdot Lgr \geq 2,$$

where $\kappa i$ is the coupling coefficient of the partial diffraction grating, and Lgr is the length of the partial diffraction grating.

10. The semiconductor device of claim 9, wherein said predetermined length of said partial diffraction grating is set such that $\kappa i \cdot Lgr$ is approximately equal to 2.

11. The semiconductor device of claim 8, wherein
    said partial diffraction grating has a thickness tgr, a distance from the active layer dsp, and a diffraction grating composition wavelength $\lambda gr$, and
    at least one of the parameters tgr, dsp, and $\lambda gr$ is a predetermined value such that the coupling coefficient $\lambda i$ is set in relation to the grating length Lgr.

12. The semiconductor device of claim 1, wherein said partial diffraction grating comprises a plurality of grating elements having a predetermined pitch such that said oscillation wavelength spectrum has a center wavelength in the range of 1100 nm–1550 nm.

13. The semiconductor laser device of claim 12, wherein said pitch of said partial diffraction grating is configured such that said center wavelength is a shorter wavelength than a peak wavelength of the gain spectrum determined by said active layer.

14. The semiconductor laser device of claim 12, wherein said pitch of said partial diffraction grating is configured such that said center wavelength is a longer wavelength than a peak wavelength of the gain spectrum determined by said active layer.

15. The semiconductor device of claim 1, further comprising another partial diffraction grating positioned on the light emitting side of the laser device.

16. The semiconductor device of claim 15, wherein a reflectivity of each of said light reflecting and light emitting facets is no greater than 5%.

17. A method for providing light from a semiconductor device comprising
    radiating light from an active layer of said semiconductor device;
    providing a light reflecting facet positioned on a first side of said active layer;
    providing a light emitting facet positioned on a second side of said active layer thereby defining a resonator between said light reflecting facet and said light emitting facet;
    providing a partial diffraction grating having a predetermined length, and integrated within the semiconductor laser device and positioned on a light reflection side of said resonator; and
    selecting said predetermined length of said partial diffraction grating such that said semiconductor device emits a light beam having a plurality of longitudinal modes within a predetermined spectral width of an oscillation wavelength spectrum of the semiconductor device.

18. The method of claim 17, wherein said step of providing a light reflecting facet comprises providing a light reflecting facet having a reflectivity of no more than 5%.

19. The method of claim 17, wherein said step of providing a light reflecting facet comprises providing a light reflecting facet having a reflectivity of no less than 80%.

20. The method of claim 17, wherein said step of providing a light emitting facet comprises providing a light emitting facet having a reflectivity of no more than 5%.

21. The method of claim 17, wherein said step of selecting said predetermined length comprises setting said predetermined length of said partial diffraction grating in relation to a length of said resonant cavity.

22. The method of claim 21, wherein said step of setting said predetermined length comprises setting the predetermined length to meet the inequality:

$$Lgr \leq \tfrac{1}{2} L,$$

where Lgr is the predetermined length of the partial diffraction grating in μm, and L is the length of the resonant cavity in μm.

23. The method of claim 22, wherein said step of setting said predetermined length comprises setting the predetermined length to be approximately equal to ½ L.

24. The method of claim 17, wherein said step of selecting said predetermined length comprises setting said predetermined length of said partial diffraction grating in relation to a coupling coefficient of said diffraction grating.

25. The method of claim 24, wherein said step of setting the predetermined length comprises setting the predetermined length of said partial diffraction grating to meet the inequality:

$$\kappa i \cdot Lgr \geq 2,$$

where κi is the coupling coefficient of the partial diffraction grating, and

Lgr is the length of the partial diffraction grating.

26. The method of claim 25, wherein said step of setting the predetermined length comprises setting the predetermined length of said partial diffraction grating approximately equal to 2.

27. The method of claim 24, further comprising setting at least one of a thickness tgr the partial diffraction grating, a distance dsp from the active layer to the partial diffraction grating, and a diffraction composition wavelength λgr of the partial diffraction grating such that a coupling coefficient κi is set to a predetermined value.

28. The method of claim 17, wherein said step of providing a partial diffraction grating comprises providing a plurality of grating elements having a predetermined pitch such that said oscillation wavelength spectrum has a center wavelength in the range of 1100 nm–1550 nm.

29. The method of claim 28, wherein said step of providing a plurality of grating elements having a predetermined pitch comprises setting the predetermined pitch such that said center wavelength is a shorter wavelength than a peak wavelength of the gain spectrum determined by said active layer.

30. The method of claim 28, wherein said step of providing a plurality of grating elements having a predetermined pitch comprises setting the predetermined pitch such that said center wavelength is a longer wavelength than a peak wavelength of the gain spectrum determined by said active layer.

31. The method of claim 17, further comprising providing another partial diffraction grating positioned on the light emitting side of the laser device.

32. The method of claim 31, wherein said steps of providing a light reflecting facet and providing a light emitting facet comprise providing a light reflecting facet and a light emitting facet each having a reflectivity of no more than 5%.

33. A semiconductor device comprising:
 means for radiating light;
 means for reflecting said radiated light positioned on a first side of said means for radiating light;
 means for emitting light positioned on a second side of said means for radiating light to thereby form a resonant cavity between said means for reflecting light and said means for emitting light; and
 means for selecting a portion of said radiated light to be emitted by said semiconductor laser device as an output light beam; and
 means for ensuring said output light beam has an oscillation wavelength spectrum having a plurality of longitudinal modes located within a predetermined spectral width of the oscillation wavelength spectrum.

34. The semiconductor device of claim 33, further comprising means for ensuring that each of the plurality of longitudinal modes within a predetermined spectral width of an oscillation wavelength spectrum of the semiconductor device has substantially the same threshold gain.

35. A semiconductor laser module comprising:
 a semiconductor laser device comprising:
  an active layer configured to radiate light;
  a light reflecting facet positioned on a first side of said active layer;
  a light emitting facet positioned on a second side of said active layer thereby defining a resonator between said light reflecting facet and said light emitting facet; and
  a partial diffraction grating having a predetermined length, and integrated within the semiconductor laser device and positioned on a light reflecting side of said resonator, wherein said predetermined length of said partial diffraction grating is selected such that said semiconductor device emits a light beam having a plurality of longitudinal modes within a predetermined spectral width of an oscillation wavelength spectrum of the semiconductor device; and
 a waveguide device for guiding said laser beam away from the semiconductor laser device.

36. The semiconductor laser module of claim 35, further comprising an internal isolator interposed between said semiconductor laser device and said waveguide device.

37. The semiconductor laser module of claim 35, further comprising a temperature control device configured to control a temperature of the semiconductor laser device.

38. An optical fiber amplifier comprising:
 a semiconductor laser device comprising:
  an active layer configured to radiate light;
  a light reflecting facet positioned on a first side of said active layer;
  a light emitting facet positioned on a second side of said active layer thereby defining a resonator between said light reflecting facet and said light emitting facet; and
  a partial diffraction grating having a predetermined length, and integrated within the semiconductor laser device and positioned on a light reflecting side of said resonator, wherein said predetermined length of said partial diffraction grating is selected such that said semiconductor device emits a light beam having a plurality of longitudinal modes within a predetermined spectral width of an oscillation wavelength spectrum of the semiconductor device; and
 an amplifying fiber coupled to said semiconductor laser device and configured to amplify a signal by using said light beam as an excitation light.

39. A wavelength division multiplexing system comprising:
 a transmission device configured to provide a plurality of optical signals having different wavelengths;
 an optical fiber amplifier coupled to said transmission device and including a semiconductor laser device comprising:
  an active layer configured to radiate light;
  a light reflecting facet positioned on a first side of said active layer;
  a light emitting facet positioned on a second side of said active layer thereby defining a resonator between said light reflecting facet and said light emitting facet; and a partial diffraction grating having a predetermined length, and integrated within the semiconductor laser device and positioned on a light reflecting side of said resonator, wherein said predetermined length of said partial diffraction grating is selected such that said semiconductor device emits a light beam having a plurality of longitudinal modes within a predetermined spectral width of an oscillation wavelength spectrum of the semiconductor device; and a receiving device coupled to said optical fiber amplifier and configured to receive said plurality of optical signals having different wavelengths.

40. A Raman amplifier comprising:

a semiconductor laser device comprising:

an active layer configured to radiate light;

a light reflecting facet positioned on a first side of said active layer;

a light emitting facet positioned on a second side of said active layer thereby defining a resonator between said light reflecting facet and said light emitting facet; and a partial diffraction grating having a predetermined length, and integrated within the semiconductor laser device and positioned on a light reflecting side of said resonator, where said predetermined length of said partial diffraction grating is selected such that said semiconductor device emits a light beam having a plurality of longitudinal modes within a predetermined spectral width of an oscillation wavelength spectrum of the semiconductor device; and a fiber coupled to said semiconductor laser device and configured to carry a signal that is amplified based on said light beam applied to said fiber.

* * * * *